(12) United States Patent
Ueno et al.

(10) Patent No.: US 12,284,263 B2
(45) Date of Patent: Apr. 22, 2025

(54) ONBOARD COMMUNICATION SYSTEM AND COMMUNICATION METHOD

(71) Applicants: Sumitomo Electric Industries, Ltd., Osaka (JP); AutoNetworks Technologies, Ltd., Yokkaichi (JP); Sumitomo Wiring Systems, Ltd., Yokkaichi (JP)

(72) Inventors: Yuto Ueno, Osaka (JP); Susumu Takeshima, Osaka (JP)

(73) Assignees: SUMITOMO ELECTRIC INDUSTRIES, LTD., Osaka (JP); AUTONETWORKS TECHNOLOGIES, LTD., Yokkaichi (JP); SUMITOMO WIRING SYSTEMS, LTD., Yokkaichi (JP)

( * ) Notice: Subject to any disclaimer, the term of this patent is extended or adjusted under 35 U.S.C. 154(b) by 175 days.

(21) Appl. No.: 18/019,245

(22) PCT Filed: Sep. 15, 2021

(86) PCT No.: PCT/JP2021/033861
§ 371 (c)(1),
(2) Date: Feb. 2, 2023

(87) PCT Pub. No.: WO2022/091616
PCT Pub. Date: May 5, 2022

(65) Prior Publication Data
US 2023/0291536 A1 Sep. 14, 2023

(30) Foreign Application Priority Data
Oct. 27, 2020 (JP) ................. 2020-179439

(51) Int. Cl.
*H04Q 11/00* (2006.01)
*H04B 10/25* (2013.01)
(Continued)

(52) U.S. Cl.
CPC .......... *H04L 7/0075* (2013.01); *H04B 10/25* (2013.01); *H04B 10/27* (2013.01);
(Continued)

(58) Field of Classification Search
None
See application file for complete search history.

(56) References Cited

U.S. PATENT DOCUMENTS 5,805,751 A * 9/1998 Kewitsch ........... G02B 6/02138
385/48
2008/0066981 A1 3/2008 Carabelli et al.
(Continued)

FOREIGN PATENT DOCUMENTS

EP 1860821 A1 11/2007
JP 6-120969 A 4/1994
(Continued)

*Primary Examiner* — Li Liu
(74) *Attorney, Agent, or Firm* — XSENSUS LLP

(57) ABSTRACT

An in-vehicle communication system includes: an optical coupler; a first in-vehicle device group composed of a plurality of in-vehicle devices connected to a first end of the optical coupler; and a second in-vehicle device group composed of a plurality of in-vehicle devices connected to a second end of the optical coupler. The in-vehicle devices in the first in-vehicle device group are communicable with the in-vehicle devices in the second in-vehicle device group via a common transmission path in the optical coupler. The in-vehicle devices in the second in-vehicle device group are communicable with the in-vehicle devices in the first in-vehicle device group via a common transmission path in the optical coupler.

9 Claims, 12 Drawing Sheets

(51) Int. Cl.
*H04B 10/27* (2013.01)
*H04L 7/00* (2006.01)

(52) U.S. Cl.
CPC . *H04Q 11/0062* (2013.01); *H04Q 2011/0045* (2013.01); *H04Q 2011/0086* (2013.01); *H04Q 2011/0088* (2013.01); *H04Q 2213/13214* (2013.01); *H04Q 2213/1336* (2013.01); *H04Q 2213/214* (2013.01)

(56) References Cited

U.S. PATENT DOCUMENTS

| | | | | |
|---|---|---|---|---|
| 2019/0319736 | A1* | 10/2019 | Hanson | H04B 7/022 |
| 2020/0053113 | A1* | 2/2020 | Sasaki | G08G 1/0116 |
| 2020/0195100 | A1* | 6/2020 | Omata | H02P 27/06 |
| 2020/0374007 | A1* | 11/2020 | Tanaka | H04L 12/403 |
| 2020/0389469 | A1* | 12/2020 | Litichever | H04W 4/40 |

FOREIGN PATENT DOCUMENTS

| | | | |
|---|---|---|---|
| JP | 8-62438 A | | 3/1996 |
| JP | 08062438 A | * | 3/1996 |
| WO | 2019/111447 A1 | | 6/2019 |

* cited by examiner

FIG. 4

| TIMING INFORMATION | SLOT INFORMATION | | | | | |
|---|---|---|---|---|---|---|
| | TS1 | TS2 | TS3 | TS4 | TS5 | TS6 |
| NNN | ID-A | ID-B | ID-C | ID-D | ID-E | ID-F |

ONBOARD COMMUNICATION SYSTEM AND COMMUNICATION METHOD

CROSS-REFERENCE TO RELATED APPLICATIONS

The present application is based on PCT/JP2021/033861, filed on Sep. 15, 2021, which claims priority on Japanese Patent Application No. 2020-179439, filed on Oct. 27, 2020, the entire contents of each are incorporated herein by reference.

TECHNICAL FIELD

The present disclosure relates to an in-vehicle communication system and a communication method.

BACKGROUND ART

PATENT LITERATURE 1 (International Publication No. WO2019/111447) discloses an in-vehicle communication system as follows. That is, this in-vehicle communication system is mounted to a vehicle, and includes a master function unit, and a plurality of slave function units. Each of the plurality of slave function units can transmit an uplink communication signal to the master function unit via at least a common optical fiber.

CITATION LIST

Patent Literature

PATENT LITERATURE 1: International Publication No. WO2019/111447

SUMMARY OF THE INVENTION

An in-vehicle communication system according to the present disclosure includes: an optical coupler; a first in-vehicle device group composed of a plurality of in-vehicle devices connected to a first end of the optical coupler; and a second in-vehicle device group composed of a plurality of in-vehicle devices connected to a second end of the optical coupler. The in-vehicle devices in the first in-vehicle device group are communicable with the in-vehicle devices in the second in-vehicle device group via a common transmission path in the optical coupler. The in-vehicle devices in the second in-vehicle device group are communicable with the in-vehicle devices in the first in-vehicle device group via a common transmission path in the optical coupler.

A communication method according to the present disclosure is a communication method in an in-vehicle communication system including: an optical coupler; a first in-vehicle device group composed of a plurality of in-vehicle devices connected to a first end of the optical coupler; and a second in-vehicle device group composed of a plurality of in-vehicle devices connected to a second end of the optical coupler. The in-vehicle devices in the first in-vehicle device group are communicable with the in-vehicle devices in the second in-vehicle device group via a common transmission path in the optical coupler. The in-vehicle devices in the second in-vehicle device group are communicable with the in-vehicle devices in the first in-vehicle device group via a common transmission path in the optical coupler. The communication method includes: transmitting optical signals from the in-vehicle devices in the first in-vehicle device group to the in-vehicle devices in the second in-vehicle device group via the optical coupler; and transmitting optical signals from the in-vehicle devices in the second in-vehicle device group to the in-vehicle devices in the first in-vehicle device group via the optical coupler.

One mode of the present disclosure can be realized not only as an in-vehicle communication system, but also as a semiconductor integrated circuit that realizes a part or the entirety of the in-vehicle communication system, or can be realized as a program for causing a computer to execute process steps in the in-vehicle communication system.

BRIEF DESCRIPTION OF DRAWINGS

FIG. 4 shows an example of a payload of a control frame generated by a processing unit in the ECU in the in-vehicle communication system according to the embodiment of the present disclosure.

DETAILED DESCRIPTION

Figure 1:
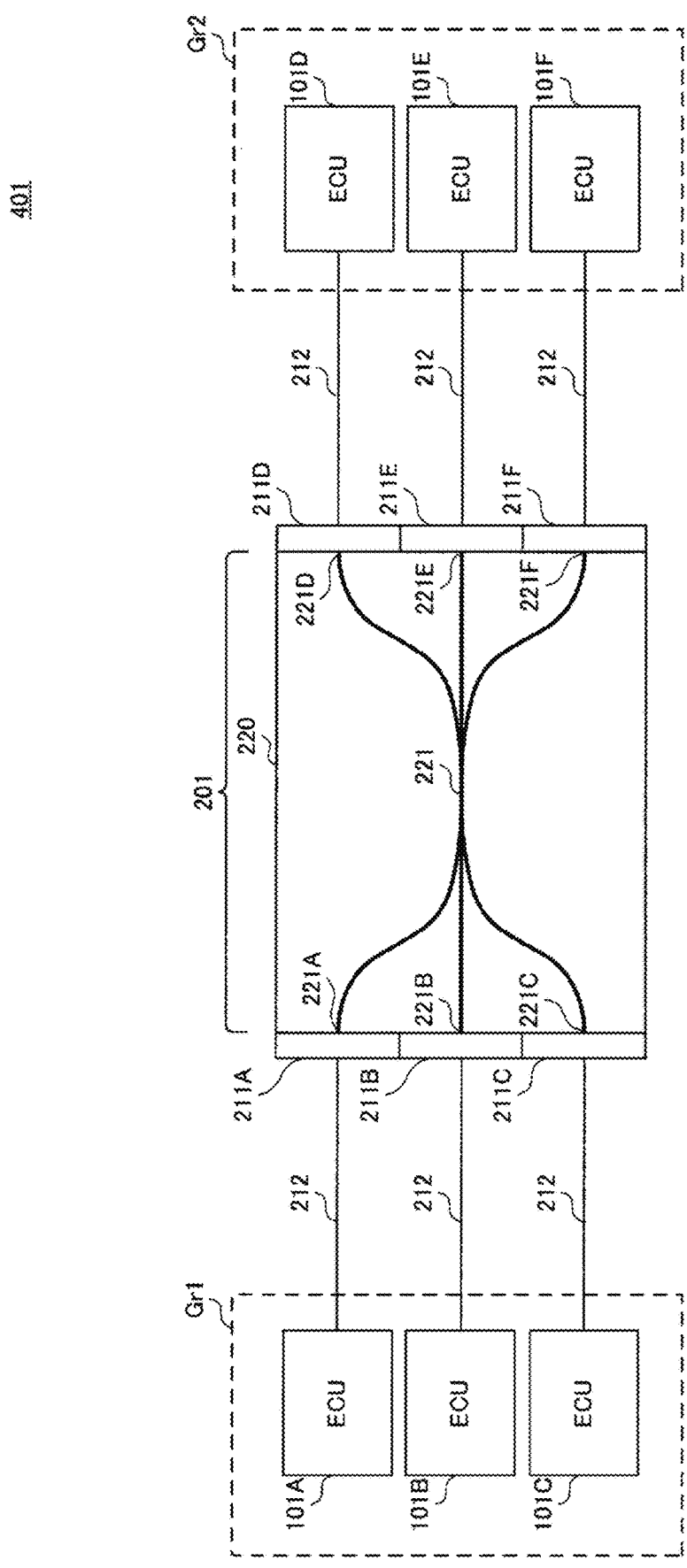
FIG. 1 shows an example of a configuration of an in-vehicle communication system according to an embodiment of the present disclosure.

Conventionally, in order to deal with an increase in data communication traffic in a vehicle, a technology using an optical fiber in an in-vehicle communication system has been proposed.

Problems to be Solved by the Present Disclosure

The technology described in PATENT LITERATURE 1 enables the plurality of slave function units to transmit communication signals to the single master function unit.

Beyond the technology described in PATENT LITERATURE 1, there is a demand for a technology that enables a plurality of in-vehicle devices to perform various communications using optical signals.

The present disclosure has been made to solve the above problem and an object of the present disclosure is to provide an in-vehicle communication system and a communication method that enable a plurality of in-vehicle devices to perform various communications using optical signals.

Effects of the Present Disclosure

According to the present disclosure, a plurality of in-vehicle devices are allowed to perform various communications using optical signals.

Description of Embodiment of the Present Disclosure

First, contents of embodiments of the present disclosure are listed and described.

(1) An in-vehicle communication system according to an embodiment of the present disclosure includes: an optical coupler; a first in-vehicle device group composed of a plurality of in-vehicle devices connected to a first end of the optical coupler; and a second in-vehicle device group composed of a plurality of in-vehicle devices connected to a second end of the optical coupler. The in-vehicle devices in the first in-vehicle device group are communicable with the in-vehicle devices in the second in-vehicle device group via a common transmission path in the optical coupler. The in-vehicle devices in the second in-vehicle device group are communicable with the in-vehicle devices in the first in-vehicle device group via a common transmission path in the optical coupler.

In the above configuration, the in-vehicle devices in the first in-vehicle device group are communicable with the in-vehicle devices in the second in-vehicle device group via the common transmission path in the optical coupler, and the in-vehicle devices in the second in-vehicle device group are communicable with the in-vehicle devices in the first in-vehicle device group via the common transmission path in the optical coupler. Thus, as compared with one-to-one in-vehicle device communication and one-to-many in-vehicle device communication, communication of more in-vehicle devices can be realized with a simple configuration. Therefore, a plurality of in-vehicle devices can perform various communications using optical signals.

(2) A master device, which is one in-vehicle device among the plurality of in-vehicle devices in the first in-vehicle device group, may transmit timing information that is information to be used for a time synchronization process by the in-vehicle devices in the in-vehicle communication system, to the second in-vehicle device group via the optical coupler. One in-vehicle device among the plurality of in-vehicle devices in the second in-vehicle device group may transmit the timing information received from the master device, to the first in-vehicle device group via the optical coupler.

In the above configuration, in addition to time synchronization of the in-vehicle devices in the second in-vehicle device group, time synchronization of the in-vehicle devices other than the master device in the first in-vehicle device group can be performed. Therefore, in the in-vehicle communication system in which time-division multiplex communication is performed, for example, each in-vehicle device can transmit an optical signal at more accurate timing.

(3) The master device may transmit, to the second in-vehicle device group via the optical coupler, slot information indicating time slots that are assigned to the respective in-vehicle devices in the in-vehicle communication system. One in-vehicle device among the plurality of in-vehicle devices in the second in-vehicle device group may transmit the slot information received from the master device, to the first in-vehicle device group via the optical coupler.

In the above configuration, the master device can inform the time slots to the other in-vehicle devices in the first in-vehicle device group and to the in-vehicle devices in the second in-vehicle device group. Therefore, for example, the content of time slot assignment can be dynamically changed.

(4) The in-vehicle devices other than the master device among the plurality of in-vehicle devices in the first in-vehicle device group may perform the time synchronization process, based on the timing information received from the second in-vehicle device group, a propagation delay of an optical signal transmitted from the master device to the second in-vehicle device group, and a propagation delay of an optical signal transmitted from the second in-vehicle device group to the first in-vehicle device group.

In the above configuration, time synchronization can be performed more accurately, taking into account the propagation delays of the optical signals.

(5) At least one of the in-vehicle devices in the in-vehicle communication system may include a clock synchronization circuit that performs a clock synchronization process with the other in-vehicle devices. The in-vehicle device including the clock synchronization circuit may turn off the clock synchronization circuit in time slots assigned to the in-vehicle devices in an own group out of the first in-vehicle device group and the second in-vehicle device group.

In the above configuration, the clock synchronization circuit can be operated more stably. Therefore, clock synchronization can be established more reliably, and a time required until the clock synchronization is established can be reduced, whereby the communication band can be effectively used. Furthermore, power consumption can be reduced as compared with a configuration in which the clock synchronization circuit is always in the ON state.

(6) The optical coupler may include: a first transmission path that is the transmission path for transmitting an optical signal from the in-vehicle devices in the first in-vehicle device group to the in-vehicle devices in the second in-vehicle device group; and a second transmission path that is the transmission path for transmitting an optical signal from the in-vehicle devices in the second in-vehicle device group to the in-vehicle devices in the first in-vehicle device group. A common time slot may be assigned to at least one in-vehicle device among the plurality of in-vehicle devices in the first in-vehicle device group and to at least one in-vehicle device among the plurality of in-vehicle devices in the second in-vehicle device group.

In the above configuration, the amount of data that can be transmitted/received in one communication frame can be increased.

(7) A communication method according to the embodiment of the present disclosure is a communication method in an in-vehicle communication system including: an optical coupler; a first in-vehicle device group composed of a plurality of in-vehicle devices connected to a first end of the optical coupler; and a second in-vehicle device group composed of a plurality of in-vehicle devices connected to a second end of the optical coupler. The in-vehicle devices in the first in-vehicle device group are communicable with the in-vehicle devices in the second in-vehicle device group via a common transmission path in the optical coupler. The in-vehicle devices in the second in-vehicle device group are communicable with the in-vehicle devices in the first in-vehicle device group via a common transmission path in the optical coupler. The communication method includes: transmitting optical signals from the in-vehicle devices in the first in-vehicle device group to the in-vehicle devices in the second in-vehicle device group via a common transmission path in the optical coupler; and transmitting optical signals from the in-vehicle devices in the second in-vehicle device group to the in-vehicle devices in the first in-vehicle device group via a common transmission path in the optical coupler.

In the above method, the in-vehicle devices in the first in-vehicle device group are communicable with the in-vehicle devices in the second in-vehicle device group via the common transmission path in the optical coupler, and the in-vehicle devices in the second in-vehicle device group are communicable with the in-vehicle devices in the first in-vehicle device group via the common transmission path in the optical coupler. In this configuration, the in-vehicle devices in the first in-vehicle device group transmit optical signals to the in-vehicle devices in the second in-vehicle device group via the optical coupler; and the in-vehicle devices in the second in-vehicle device group transmit optical signals to the in-vehicle devices in the first in-vehicle device group via the optical coupler. Thus, as compared with one-to-one in-vehicle device communication and one-to-many in-vehicle device communication, communication of more in-vehicle devices can be realized with a simple configuration. Therefore, a plurality of in-vehicle devices can perform various communications using optical signals.

Hereinafter, embodiments of the present disclosure will be described with reference to the drawings. In the drawings, the same or corresponding parts are denoted by the same reference signs, and description thereof is not repeated. At least some parts of the embodiments described below may be combined together as desired.

Configuration and Basic Operation

FIG. 1 shows an example of a configuration of an in-vehicle communication system according to an embodiment of the present disclosure. With reference to FIG. 1, an in-vehicle communication system 401 includes an optical coupler 201, a first in-vehicle device group Gr1 composed of ECUs (Electronic Control Units) 101A, 101B, 101C, and a second in-vehicle device group Gr2 composed of ECUs 101D, 101E, 101F. Hereinafter, each of the ECUs 101A, 101B, 101C, 101D, 101E, 101F is also referred to as an ECU 101. An ECU 101 is an example of an in-vehicle device.

The in-vehicle communication system 401 is installed in a vehicle. For example, the in-vehicle communication system 401 is a PON (Passive Optical Network) system. The in-vehicle communication system 401 may be an optical communication system other than the PON system.

The optical coupler 201 includes a film-shaped body portion 220, and an optical waveguide 221 formed in the body portion 220. For example, the optical coupler 201 is made of resin. More specifically, the optical coupler 201 is produced by forming the optical waveguide 221 in the body portion 220 made of resin, through a photolithographic technique or the like.

The optical waveguide 221 is formed in the body portion 220 so as to extend between connection parts 211A, 211B, 211C disposed at a first end of the optical coupler 201 and connection parts 211D, 211E, 211F disposed at a second end of the optical coupler 201. The optical waveguide 221 has branch parts. For example, the optical waveguide 221 has a first end 221A connected to the connection part 211A, a second end 221B connected to the connection part 211B, a third end 221C connected to the connection part 211C, a fourth end 221D connected to the connection part 211D, a fifth end 221E connected to the connection part 211E, and a sixth end 221F connected to the connection part 211F. Hereinafter, each of the connection parts 211A, 211B, 211C, 211D, 211E, 211F is also referred to as a connection part 211.

The ECUs 101A, 101B, 101C in the first in-vehicle device group Gr1 are connected to the first end of the optical coupler 201. More specifically, the ECUs 101A, 101B, 101C are connected to the connection parts 211A, 211B, 211C via optical fiber cables 212, respectively. The first in-vehicle device group Gr1 may be composed of two ECUs 101, or four or more ECUs 101.

The first end 221A of the optical waveguide 221 is optically connected to the corresponding optical fiber cable 212 at the connection part 211A. The second end 221B of the optical waveguide 221 is optically connected to the corresponding optical fiber cable 212 at the connection part 211B. The third end 221C of the optical waveguide 221 is optically connected to the corresponding optical fiber cable 212 at the connection part 211C.

The ECUs 101D, 101E, 101F in the second in-vehicle device group Gr2 are connected to the second end of the optical coupler 201. More specifically, the ECUs 101D, 101E, 101F are connected to the connection parts 211D, 211E, 211F via optical fiber cables 212, respectively. The second in-vehicle device group Gr2 may be composed of two ECUs 101, or four or more ECUs 101.

The fourth end 221D of the optical waveguide 221 is optically connected to the corresponding optical fiber cable 212 at the connection part 211D. The fifth end 221E of the optical waveguide 221 is optically connected to the corresponding optical fiber cable 212 at the connection part 211E. The sixth end 221F of the optical waveguide 221 is optically connected to the corresponding optical fiber cable 212 at the connection part 211F.

Examples of the ECU 101 include an automated driving ECU, a navigation device, a TCU (Telematics Communication Unit), a gateway device, a camera ECU, a millimeter-wave sensor ECU, a LiDAR (Light Detection and Ranging) ECU, a storage ECU, and an antenna module.

For example, the ECUs 101D, 101E, 101F are camera ECUs. The ECUs 101A, 101B are automated driving ECUs. The ECU 101C is a storage ECU. Since the in-vehicle communication system 401 can realize a redundant configuration of an automated driving ECU by using the ECUs 101A, 101B, automated driving control can be continued even if one of the ECUs 101A, 101B has failed.

The ECUs 101A, 101B, 101C in the first in-vehicle device group Gr1 are communicable with the ECUs 101D, 101E, 101F in the second in-vehicle device group Gr2 via a common transmission path in the optical coupler 201. The ECUs 101D, 101E, 101F in the second in-vehicle device group Gr2 are communicable with the ECUs 101A, 101B, 101C in the first in-vehicle device group Gr1 via the common transmission path in the optical coupler 201. For example, the ECUs 101A, 101B, 101C and the ECUs 101D, 101E, 101F are mutually communicable via the optical waveguide 221 in the optical coupler 201.

A direction from the first in-vehicle device group Gr1 to the second in-vehicle device group Gr2 is referred to as an uplink direction, and a direction from the second in-vehicle device group Gr2 to the first in-vehicle device group Gr1 is referred to as a downlink direction. The in-vehicle communication system 401 is a TDM-PON system, for example. Specifically, in the in-vehicle communication system 401, time division multiplexing (TDM) communication is performed in the uplink direction and the downlink direction.

Each of the ECUs 101D, 101E, 101F can transmit an uplink optical signal including uplink communication data such as a frame to the ECUs 101A, 101B, 101C via the corresponding optical fiber cable 212, the corresponding connection part 211, and the optical coupler 201. Each of the ECUs 101A, 101B, 101C can transmit a downlink optical signal including downlink communication data such as a frame to the ECUs 101D, 101E, 101F via the corresponding optical fiber cable 212, the corresponding connection part 211, and the optical coupler 201. For example, each ECU 101 transmits and receives optical signals of the same wavelength. Each ECU 101 is assigned a time slot TS that is a period in which the ECU 101 can transmit an optical signal, and transmits an optical signal in the assigned time slot TS.

One of the ECUs 101 in the first in-vehicle device group Gr1 is a master device. For example, the ECU 101A is a master device. One of the ECUs 101 in the second in-vehicle device group Gr2 is a sub-master device. For example, the ECU 101D is a sub-master device.

ECU

Figure 2:
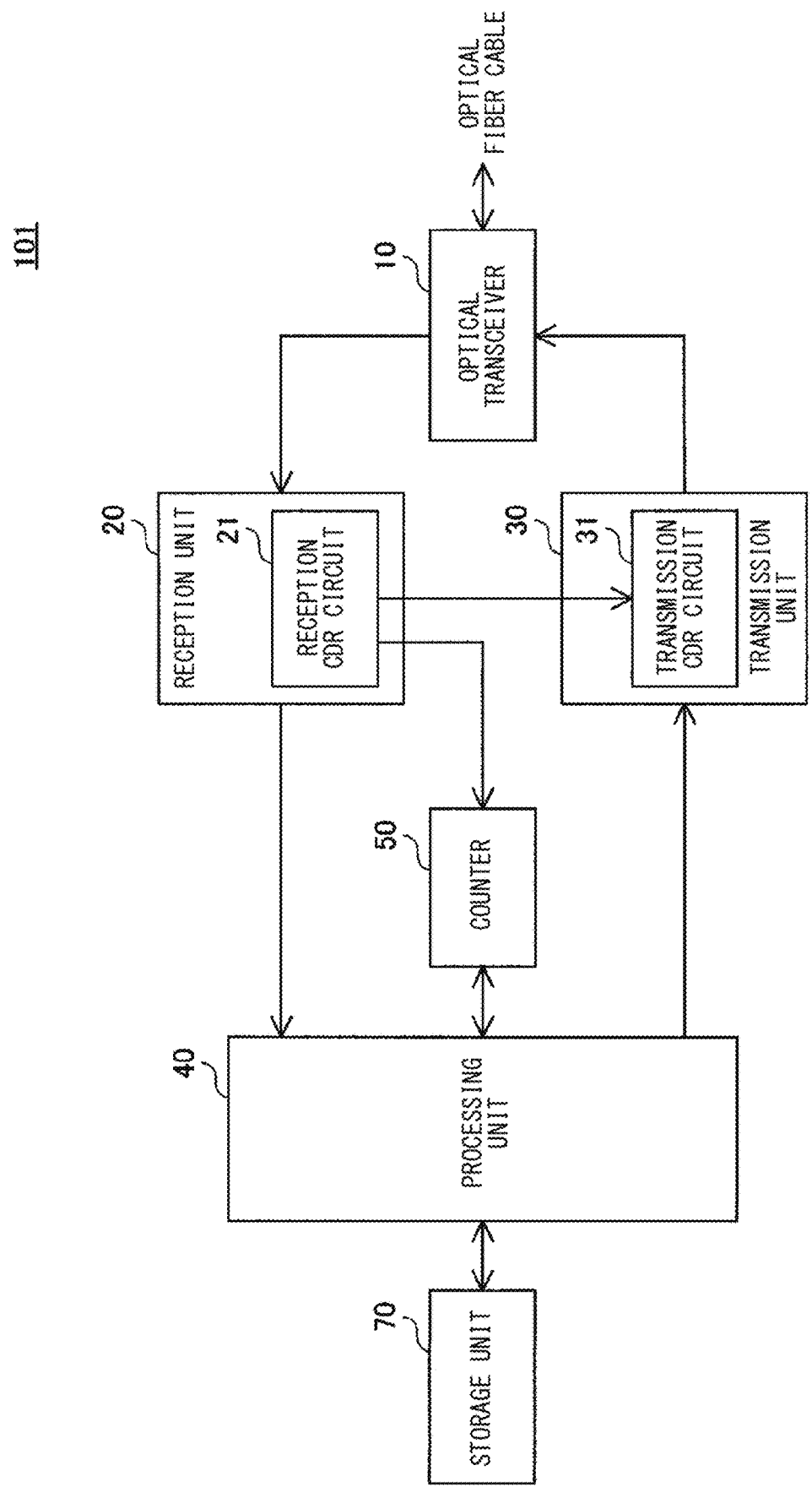
FIG. 2 shows an example of a configuration of an ECU in the in-vehicle communication system according to the embodiment of the present disclosure.

FIG. 2 shows an example of a configuration of an ECU in the in-vehicle communication system according to the embodiment of the present disclosure. FIG. 2 shows a configuration of any of the ECUs 101 other than the ECU 101A.

With reference to FIG. 2, the ECU 101 other than the ECU 101A includes an optical transceiver 10, a reception unit 20, a transmission unit 30, a processing unit 40, a counter 50, and a storage unit 70. The reception unit 20 includes a reception CDR (Clock and Data Recovery) circuit 21. The transmission unit 30 includes a transmission CDR circuit 31. The reception CDR circuit 21 is an example of a clock synchronization circuit.

The processing unit 40 is realized by a processor such as a CPU (Central Processing Unit) or a DSP (Digital Signal Processor), for example. The storage unit 70 is a nonvolatile memory, for example.

The processing unit 40 periodically or non-periodically generates a frame addressed to another ECU 101, and outputs the generated frame to the transmission unit 30. More specifically, for example, the processing unit 40 in the ECU 101D as a camera ECU receives image information indicating a captured image from a camera unit (not shown) that captures an area in front of the vehicle, generates a data frame that is a frame in which the received image information and a time stamp based on a count value of the counter 50 are stored, and outputs the data frame to the transmission unit 30.

The transmission unit 30 outputs the frame received from the processing unit 40 to the optical transceiver 10.

The optical transceiver 10 converts an electric signal indicating the frame received from the transmission unit 30 into an optical signal, and transmits the optical signal to another ECU 101 via the optical fiber cable 212 and the optical coupler 201. More specifically, the optical transceiver 10 in an ECU 101 in the second in-vehicle device group Gr2 transmits the optical signal to an ECU 101 in the first in-vehicle device group Gr1 via the optical fiber cable 212 and the optical coupler 201. The optical transceiver 10 in an ECU 101 in the first in-vehicle device group Gr1 transmits the optical signal to an ECU 101 in the second in-vehicle device group Gr2 via the optical fiber cable 212 and the optical coupler 201.

The optical transceiver 10 receives an optical signal from another ECU 101 via the optical fiber cable 212 and the optical coupler 201, converts the received optical signal into an electric signal, and outputs the electric signal to the reception unit 20. More specifically, the optical transceiver 10 in an ECU 101 in the first in-vehicle device group Gr1 receives the optical signal from an ECU 101 in the second in-vehicle device group Gr2 via the optical fiber cable 212 and the optical coupler 201, converts the received optical signal into an electric signal, and outputs the electric signal to the reception unit 20. The optical transceiver 10 in an ECU 101 in the second in-vehicle device group Gr2 receives the optical signal from an ECU 101 in the first in-vehicle device group Gr1 via the optical fiber cable 212 and the optical coupler 201, converts the received optical signal into an electric signal, and outputs the electric signal to the reception unit 20.

Upon receiving the electric signal from the optical transceiver 10, the reception unit 20 reconstitutes a frame from the electric signal, and outputs the reconstituted frame to the processing unit 40.

Upon receiving the frame from the reception unit 20, the processing unit 40 performs various processes based on the received frame. More specifically, for example, the processing unit 40 in the ECU 101B as an automated driving ECU receives a data frame in which image information is stored, acquires the image information from the received data frame, and performs an automated driving control based on the acquired image information. Meanwhile, for example, the processing unit 40 in the ECU 101C as a storage ECU receives a data frame in which image information is stored, acquires the image information from the received data frame, and accumulates the acquired image information in the storage unit 70.

Figure 3:
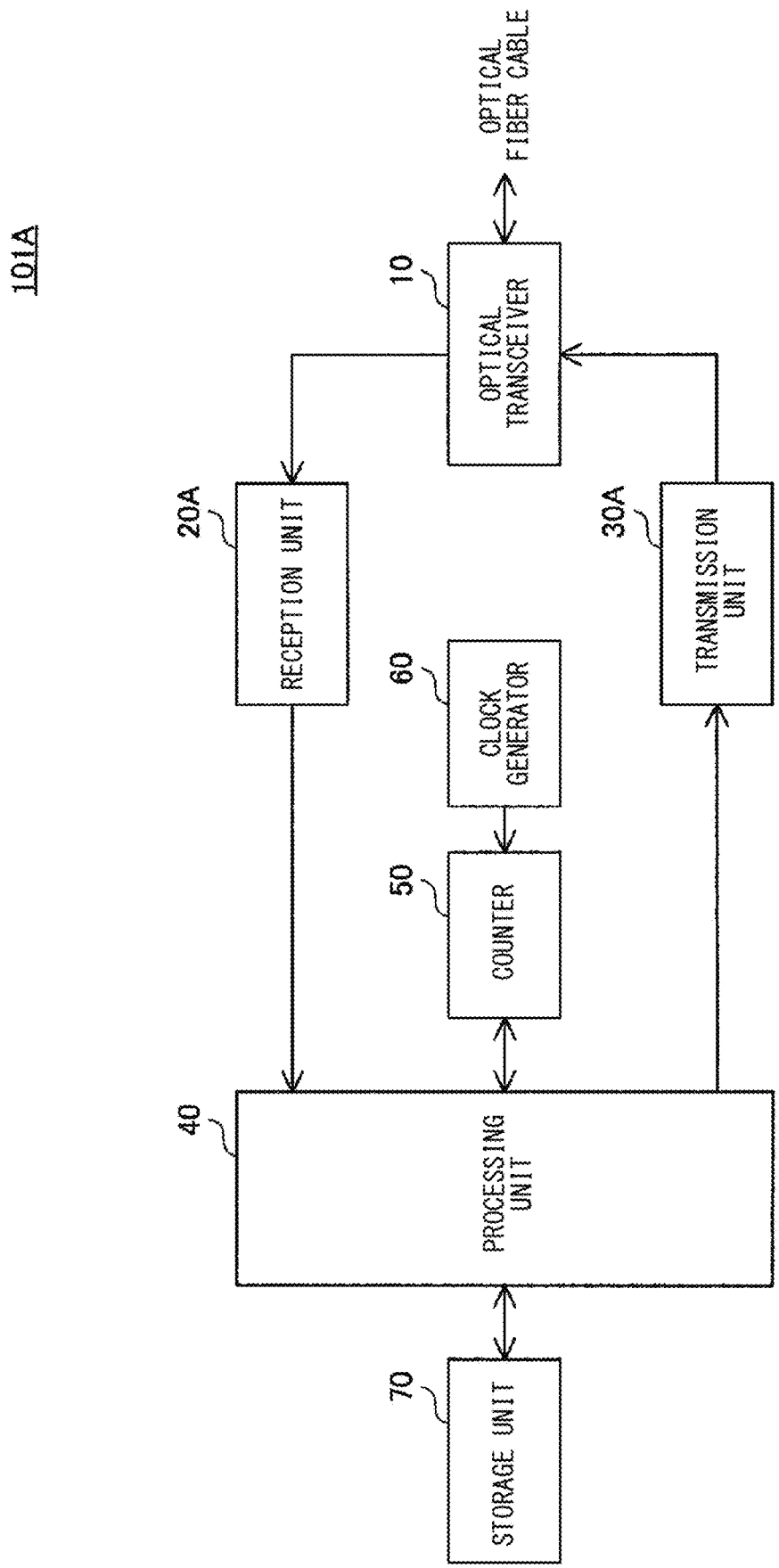
FIG. 3 shows an example of a configuration of an ECU in the in-vehicle communication system according to the embodiment of the present disclosure.

FIG. 3 shows an example of a configuration of an ECU in the in-vehicle communication system according to the embodiment of the present disclosure. FIG. 3 shows a configuration of the ECU 101A as a master device.

With reference to FIG. 3, the ECU 101A is different from the ECUs 101 other than the ECU 101A in that it includes a reception unit 20A and a transmission unit 30A instead of the reception unit 20 and the transmission unit 30, and further includes a clock generator 60.

Like the reception units 20 in the ECUs 101 other than the ECU 101A, the reception unit 20A receives an electric signal from the optical transceiver 10, reconstitutes a frame from the electric signal, and outputs the reconstituted frame to the processing unit 40.

The processing unit 40 in the ECU 101A generates a frame addressed to another ECU 101, and outputs the generated frame to the transmission unit 30A. For example, like the processing unit 40 in the ECU 101B, the processing unit 40 in the ECU 101A as an automated driving ECU receives a data frame in which image information is stored, acquires the image information from the received data frame, and performs an automated driving control based on the acquired image information.

Like the transmission units 30 in the ECUs 101 other than the ECU 101A, the transmission unit 30A outputs the frame received from the processing unit 40 to the optical transceiver 10.

The clock generator 60 includes, for example, a VCO (Voltage Controlled Oscillator), and generates a clock pulse as a reference clock. Each of the units in the ECU 101A is operated according to timing of the reference clock generated by the clock generator 60.

The counter 50 counts a clock pulse received from the clock generator 60, and holds a count value that is the counted value.

In the in-vehicle communication system 401, the ECU 101A and the ECUs 101 other than the ECU 101A may have the same hardware configuration. That is, in the in-vehicle communication system 401, the ECU 101A may include the reception unit 20 and the transmission unit 30 instead of the reception unit 20A and the transmission unit 30A, and the ECUs 101 other than the ECU 101A may include the clock generator 60.

Clock Synchronization Process and Time Synchronization Process

<Master Device>

For example, the ECU 101A as a master device transmits, to the second in-vehicle device group Gr2 via the optical coupler 201, timing information that is used for a time synchronization process by the other ECUs 101 in the in-vehicle communication system 401, and slot information indicating time slots TS assigned to the respective ECUs 101 in the in-vehicle communication system 401.

More specifically, the storage unit 70 in the ECU 101A has, stored therein, slot information indicating a correspondence relationship between the number of the time slot TS assigned to each ECU 101 and the ID (Identifier) of the ECU 101. Hereinafter, the IDs of the ECUs 101A, 101B, 101C, 101D, 101E, 101F are referred to as "ID-A", "ID-B", "ID-C", "ID-D", "ID-E", "ID-F", respectively.

For example, at the time of startup or at a synchronization processing timing according to a predetermined cycle, the processing unit 40 in the ECU 101A generates timing information based on the count value held by the counter 50. More specifically, for example, the processing unit 40 generates timing information indicating the count value of the counter 50.

The processing unit 40 may generate timing information indicating a count value taking into account a frequency deviation of the VCO in the clock generator 60. More specifically, for example, the storage unit 70 in the ECU 101A has, stored therein, a correction amount that is predetermined based on the frequency deviation of the VCO. The processing unit 40 acquires the correction amount from the storage unit 70, and generates timing information indicating a value obtained by adding or subtracting the correction amount to or from the count value of the counter 50.

As described above, since the count value is corrected based on the frequency deviation of the VCO, an accurate count value, taking into account the frequency deviation unique to the VCO, can be notified to the other ECUs 101. The processing unit 40 may be configured to: receive a frame in which a count value is stored and which is periodically transmitted from another ECU 101; calculate a frequency deviation of the VCO, based on a result of comparison between the count value in the received frame and the count value of the own counter 50; acquire a correction amount corresponding to the calculated frequency deviation from, for example, a correspondence table in the storage unit 70; and generate timing information by using the acquired correction amount.

After generating the timing information, the processing unit 40 acquires the slot information from the storage unit 70, generates a control frame as a frame including the generated timing information and the acquired slot information, and outputs the generated control frame to the transmission unit 30A.

Figure 4:
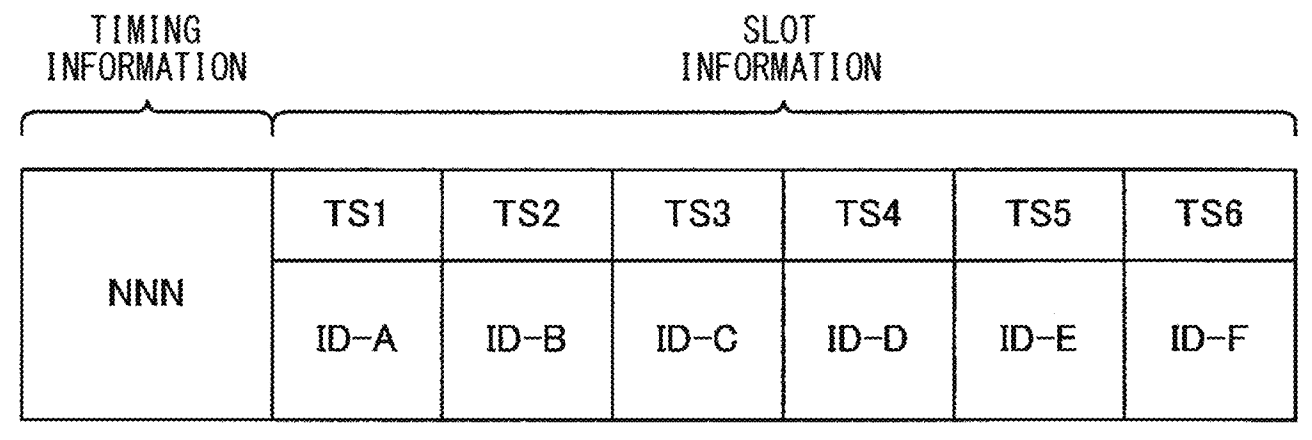

FIG. 4 shows an example of a payload of a control frame generated by a processing unit in an ECU in the in-vehicle communication system according to the embodiment of the present disclosure. With reference to FIG. 4, in the payload of the control frame, for example, "NNN", which is the count value of the counter 50 of the ECU 101A at the synchronization processing timing, is stored as timing information.

Furthermore, the payload of the control frame has, stored therein, slot information indicating that the first time slot TS1 in one communication frame between ECUs 101 is assigned to the ECU 101A, the second time slot TS2 is assigned to the ECU 101B, the third time slot TS3 is assigned to the ECU 101C, the fourth time slot TS4 is assigned to the ECU 101D, the fifth time slot TS5 is assigned to the ECU 101E, and the sixth time slot TS6 is assigned to the ECU 101F.

The transmission unit 30A in the ECU 101A outputs the control frame received from the processing unit 40 to the optical transceiver 10.

The optical transceiver 10 in the ECU 101A converts an electric signal indicating the control frame received from the transmission unit 30A into an optical signal, and transmits the optical signal to the ECUs 101D, 101E, 101F in the second in-vehicle device group Gr2 via the optical fiber cables 212 and the optical coupler 201.

<Second In-Vehicle Device Group>

Referring back to FIG. 2, upon receiving the electric signal from the optical transceiver 10, the reception unit 20 in each of the ECUs 101D, 101E, 101F reconstitutes a control frame from the electric signal, and outputs the reconstituted control frame to the processing unit 40.

(Clock Synchronization Process)

The reception CDR circuit 21 in the reception unit 20 in each of the ECUs 101D, 101E, and 101F performs a clock synchronization process of making the ECU 101 be in clock synchronization with the ECU 101A as the master device, based on the optical signal received from the ECU 101A The reception CDR circuit 21 generates a clock for making the ECU 101 operate in synchronization with the ECU 101A. The respective units in the ECU 101 are operated according to the timing of the clock generated by the reception CDR circuit 21.

Specifically, the reception CDR circuit 21 includes a PLL (Phase Locked Loop) circuit, and extracts a reception clock from the signal received from the ECU 101A, by using the PLL circuit. More specifically, the reception CDR circuit 21 generates a reception clock, based on the electric signal received from the optical transceiver 10. By using the reception clock, the reception CDR circuit 21 samples a reception burst signal that is the electric signal received from the optical transceiver 10. The reception CDR circuit 21 outputs the reception clock to the counter 50 and the transmission CDR circuit 31.

The counter 50 counts the pulse of the reception clock received from the reception CDR circuit 21, and holds a count value that is the counted value.

The transmission CDR circuit 31 in the transmission unit 30 in each of the ECUs 101D, 101E, 101F includes a PLL circuit, and generates, by using the PLL circuit, a transmission clock synchronized with the reception clock extracted by the reception CDR circuit 21. The transmission CDR circuit 31 performs retiming of data to be transmitted to the ECUs 101 in the first in-vehicle device group Gr1, by using the generated transmission clock. Specifically, the transmission CDR circuit 31 outputs the frame, which is received from the processing unit 40 and is to be transmitted to the ECUs 101 in the first in-vehicle device group Gr1, to the optical transceiver 10 according to the timing of the transmission clock.

Figure 5:
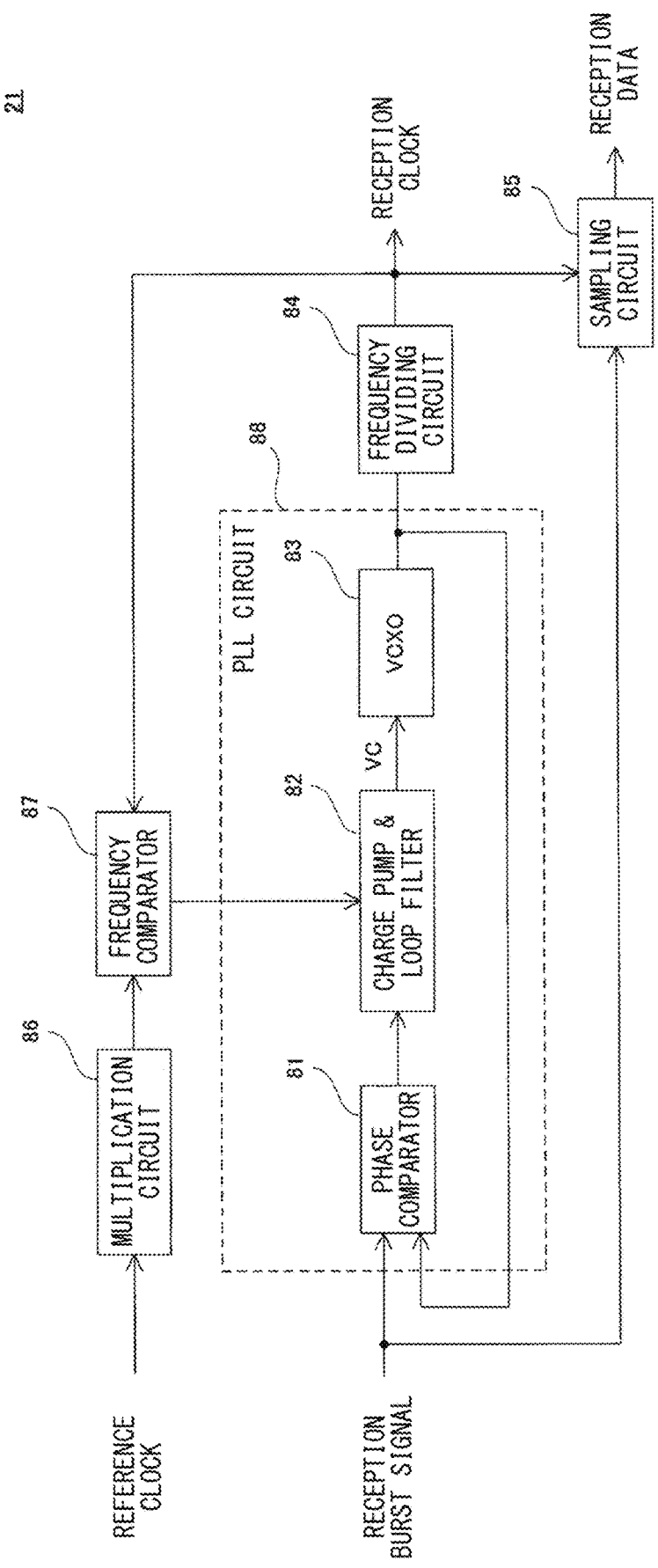
FIG. 5 shows a configuration of a reception CDR circuit in a reception unit of the ECU according to the embodiment of the present disclosure.

FIG. 5 shows a configuration of a reception CDR circuit in a reception unit in an ECU according to the embodiment of the present disclosure. With reference to FIG. 5, the reception CDR circuit 21 includes a frequency dividing circuit 84, a sampling circuit 85, a multiplication circuit 86, a frequency comparator 87, and a PLL circuit 88. The PLL circuit 88 includes a phase comparator 81, a charge pump & loop filter 82, and a VCXO (Voltage Controlled Crystal Oscillator) 83.

The PLL circuit 88 controls the VCXO 83, based on the timing of the reception burst signal received from the optical transceiver 10. More specifically, the PLL circuit 88 generates a control voltage VC, based on the reception burst signal received from the optical transceiver 10 and on a reference clock generated in the ECU 101, and supplies the control voltage VC to the VCXO 83. Thus, the PLL circuit 88 generates a reception clock that is synchronized with the reception burst signal, and that has a frequency component in which a component, not lower than a predetermined frequency, of a frequency component of the reception burst signal received from the optical transceiver 10 is attenuated.

Specifically, in the PLL circuit 88, the phase comparator 81 compares the phase of the reception burst signal with the phase of an output signal from the VCXO 83, and outputs a phase difference signal indicating a comparison result to the charge pump & loop filter 82.

Followability of the PLL circuit 88 is set according to a time constant of the charge pump & loop filter 82. Specifically, the time constant of the charge pump & loop filter 82 is set such that the PLL circuit 88 does not follow noise having high frequency components such as harmonics.

The VCXO 83 generates and outputs an oscillation signal. The VCXO 83 receives, as the control voltage VC, the phase difference signal having passed through the charge pump & loop filter 82, and changes the frequency of the oscillation signal according to the control voltage VC. The oscillation signal outputted from the VCXO 83 is outputted to the phase comparator 81 and the frequency dividing circuit 84.

The frequency dividing circuit 84 divides the frequency of the oscillation signal received from the VCXO 83, and outputs the frequency-divided signal as a reception clock.

In response to the reception clock received from the frequency dividing circuit 84, the sampling circuit 85 holds the reception burst signal from the optical transceiver 10, and outputs the reception burst signal as reception data. The reception unit 20 reconstitutes a frame from the reception data.

The multiplication circuit 86 outputs a clock obtained by multiplying the reference clock generated in the ECU 101, by a predetermined number.

The frequency comparator 87 compares the clock received from the multiplication circuit 86 with the reception clock received from the frequency dividing circuit 84, and outputs a frequency difference signal indicating a frequency difference between these clocks, to the charge pump & loop filter 82.

Based on the frequency difference signal outputted from the frequency comparator 87 to the charge pump & loop filter 82, the control voltage VC is adjusted such that the frequency of the reception clock matches the frequency of the clock outputted from the multiplication circuit 86.

Figure 6:
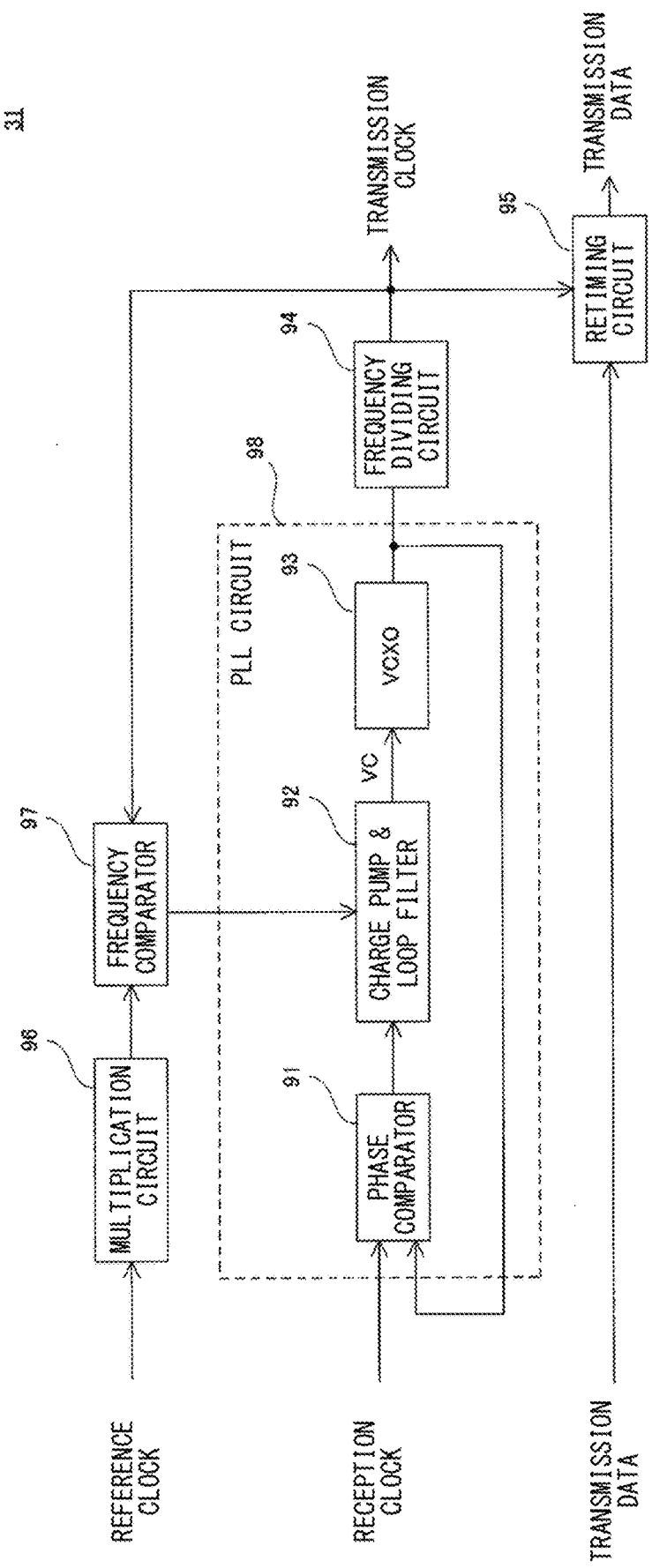
FIG. 6 shows a configuration of a transmission CDR circuit in a transmission unit of the ECU according to the embodiment of the present disclosure.

FIG. 6 shows a configuration of a transmission CDR circuit in a transmission unit in an ECU according to the embodiment of the present disclosure. With reference to FIG. 6, the transmission CDR circuit 31 includes a frequency dividing circuit 94, a retiming circuit 95, a multiplication circuit 96, a frequency comparator 97, and a PLL circuit 98. The PLL circuit 98 includes a phase comparator 91, a charge pump & loop filter 92, and a VCXO 93.

The PLL circuit 98 controls the VCXO 93, based on timing of the reception clock received from the reception CDR circuit 21. More specifically, the PLL circuit 98 generates a control voltage VC, based on the reception clock received from the reception CDR circuit 21 and on a reference clock generated in the ECU 101, and supplies the control voltage VC to the VCXO 93. Thus, the PLL circuit 98 generates a transmission clock that is synchronized with the reception clock, and that has a frequency component in which a component, not lower than a predetermined frequency, of a frequency component of the reception clock received from the reception CDR circuit 21 is attenuated.

Specifically, in the PLL circuit 98, the phase comparator 91 compares the phase of the reception clock with the phase of an output signal from the VCXO 93, and outputs a phase difference signal indicating a comparison result to the charge pump & loop filter 92.

Followability of the PLL circuit 98 is set according to a time constant of the charge pump & loop filter 92. Specifically, the time constant of the charge pump & loop filter 92 is set such that the PLL circuit 98 does not follow noise having high frequency components such as harmonics.

The VCXO 93 generates and outputs an oscillation signal. The VCXO 93 receives, as the control voltage VC, the phase difference signal having passed through the charge pump & loop filter 92, and changes the frequency of the oscillation signal according to the control voltage VC. The oscillation signal outputted from the VCXO 93 is outputted to the phase comparator 91 and the frequency dividing circuit 94.

The frequency dividing circuit 94 divides the frequency of the oscillation signal received from the VCXO 93, and outputs the frequency-divided signal as a transmission clock.

In response to the transmission clock received from the frequency dividing circuit 94, the retiming circuit 95 holds and outputs transmission data that is a frame from the processing unit 40. The optical transceiver 10 converts the transmission data outputted from the retiming circuit 95 into an optical signal, and transmits the optical signal to another ECU 101.

The multiplication circuit 96 outputs a clock obtained by multiplying the reference clock generated in the ECU 101, by a predetermined number.

The frequency comparator 97 compares the clock received from the multiplication circuit 96 with the transmission clock received from the frequency dividing circuit 94, and outputs a frequency difference signal indicating a frequency difference between these clocks, to the charge pump & loop filter 92.

Based on the frequency difference signal outputted from the frequency comparator 97 to the charge pump & loop filter 92, the control voltage VC is adjusted such that the frequency of the transmission clock matches the frequency of the clock outputted from the multiplication circuit 96.

(Time Synchronization Process)

The processing unit 40 in each of the ECUs 101D, 101E, 101F receives a control frame from the reception unit 20, and acquires timing information and slot information from the received control frame.

The processing unit 40 stores the acquired slot information in the storage unit 70. Furthermore, based on the acquired timing information, the processing unit 40 performs a time synchronization process of making the ECU 101 be in time synchronization with the ECU 101A as the master device. More specifically, the processing unit 40 updates the count value of the counter 50, based on the acquired timing information.

For example, the ECU 101 in the second in-vehicle device group Gr2 performs the time synchronization process, based on the timing information received from the ECU 101A and on a propagation delay D1 of the optical signal transmitted from the ECU 101A to the second in-vehicle device group Gr2.

More specifically, the storage unit 70 in each of the ECUs 101D, 101E, 101F has, stored therein, the propagation delay D1 that is measured or calculated in advance.

In the time synchronization process, the processing unit 40 in each of the ECUs 101D, 101E, 101F updates the count value of the counter 50 to a value obtained by adding the count value indicated by the acquired timing information to the count value corresponding to the propagation delay D1 in the storage unit 70.

Furthermore, for example, the processing unit 40 in each of the ECUs 101D, 101E, 101F acquires, from the storage unit 70, a correction amount that is set in advance based on a frequency deviation of the VCXO 83 in the reception CDR circuit 21, and updates the count value of the counter 50 to a value obtained by adding or subtracting the correction amount to or from the count value. Thus, since the count value is updated based on the frequency deviation of the VCXO 83, the count value can be updated to an accurate value, taking into account the frequency deviation unique to the VCXO 83. The processing unit 40 may be configured to: receive a frame in which a count value is stored and which is periodically transmitted from the ECU 101A; calculate the frequency deviation of the VCXO 83, based on a result of comparison between the count value in the received frame and the count value of the own counter 50; acquire a correction amount corresponding to the calculated frequency deviation from the storage unit 70; and update the count value of the counter 50 by using the acquired correction amount.

One of the ECUs 101 in the second in-vehicle device group Gr2 transmits the timing information received from the ECU 101A and the slot information received from the ECU 101A to the first in-vehicle device group Gr1 via the optical coupler 201. For example, the ECU 101D as a sub-master device transfers a control frame received from the ECU 101A, to the first in-vehicle device group Gr1.

More specifically, the processing unit 40 in the ECU 101D outputs the control frame received from the reception unit 20 to the transmission unit 30.

The transmission unit 30 in the ECU 101D outputs the control frame received from the processing unit 40 to the optical transceiver 10.

The optical transceiver 10 in the ECU 101D converts an electric signal indicating the control frame received from the transmission unit 30 into an optical signal, and transmits the optical signal to the ECUs 101A, 101B, 101C in the first in-vehicle device group Gr1 via the optical fiber cable 212 and the optical coupler 201.

<First In-Vehicle Device Group>

The reception unit 20 in each of the ECUs 101B, 101C receives an electric signal from the optical transceiver 10, reconstitutes a control frame from the electric signal, and outputs the reconstituted control frame to the processing unit 40.

(Clock Synchronization Process)

Based on the optical signal received from the ECU 101D, the reception CDR circuit 21 in the reception unit 20 in each of the ECUs 101B, 101C performs a clock synchronization process of making the ECU 101 be in clock synchronization with the ECU 101A as the master device, like the reception CDR circuit 21 in the reception unit 20 in each of the ECUs 101D, 101E, 101F. The reception CDR circuit 21 generates a clock for making the ECU 101 operate in synchronization with the ECU 101A. The respective units in the ECU 101 are operated according to the timing of the clock generated by the reception CDR circuit 21.

The counter 50 counts the pulse of the reception clock received from the reception CDR circuit 21, and holds a count value that is the counted value.

Like the transmission CDR circuit 31 in the transmission unit 30 in each of the ECUs 101D, 101E, 101F, the transmission CDR circuit 31 in the transmission unit 30 in each of the ECUs 101B, 101C generates a transmission clock synchronized with the reception clock extracted by the reception CDR circuit 21, and performs retiming of data to be transmitted to the ECUs 101 in the second in-vehicle device group Gr2, by using the generated transmission clock.

(Time Synchronization Process)

The processing unit 40 in each of the ECUs 101B, 101C receives the control frame from the reception unit 20, and acquires timing information and slot information from the received control frame.

The processing unit 40 stores the acquired slot information in the storage unit 70. Furthermore, based on the acquired timing information, the processing unit 40 performs a time synchronization process of making the ECU 101 be in time synchronization with the ECU 101A as the master device. More specifically, the processing unit 40 updates the count value of the counter 50, based on the acquired timing information.

For example, the ECUs 101B, 101C, which are ECUs 101 other than the ECU 101A among the ECUs 101 in the first in-vehicle device group Gr1, perform a time synchronization process based on the timing information received from the second in-vehicle device group Gr2, the propagation delay D1, and a propagation delay D2 of the optical signal transmitted from the second in-vehicle device group Gr2 to the first in-vehicle device group Gr1.

Furthermore, for example, the ECUs 101B, 101C perform the time synchronization process, further based on a transfer delay time D3 that is required when the ECU 101D as the sub-master device transfers, to the first in-vehicle device group Gr1, the control frame received from the ECU 101A.

More specifically, the storage unit 70 in each of the ECUs 101B, 101C has, stored therein, the propagation delays D1, D2 and the transfer delay time D3 that are measured or calculated in advance.

In the time synchronization process, the processing unit 40 in each of the ECUs 101B, 101C updates the count value of the counter 50 to a value obtained by adding the count value indicated by the acquired timing information, to the count values corresponding to the propagation delays D1, D2 and the transfer delay time D3 in the storage unit 70.

Furthermore, for example, the processing unit 40 in each of the ECUs 101B, 101C acquires, from the storage unit 70, a correction amount that is predetermined based on the frequency deviation of the VCXO 83 in the reception CDR circuit 21, and updates the count value of the counter 50 to a value obtained by further adding or subtracting the correction amount to or from the count value. The processing unit 40 may be configured to: receive a frame in which a count value is stored and which is periodically transmitted from the ECU 101A; calculate a frequency deviation of the VCXO 83, based on a result of comparison between the count value in the received frame and the count value of the own counter 50; acquire a correction amount corresponding to the calculated frequency deviation from the storage unit 70; and update the count value of the counter 50 by using the acquired correction amount.

Example of Optical Signal Transmission Timing

Each of the ECUs 101 in the first in-vehicle device group Gr1 transmits an optical signal to the ECUs 101 in the second in-vehicle device group Gr2 via the optical coupler 201, in the time slot TS assigned thereto. Meanwhile, each of the ECUs 101 in the second in-vehicle device group Gr2 transmits an optical signal to the ECUs 101 in the first in-vehicle device group Gr1 via the optical coupler 201, in the time slot TS assigned thereto.

Figure 7:
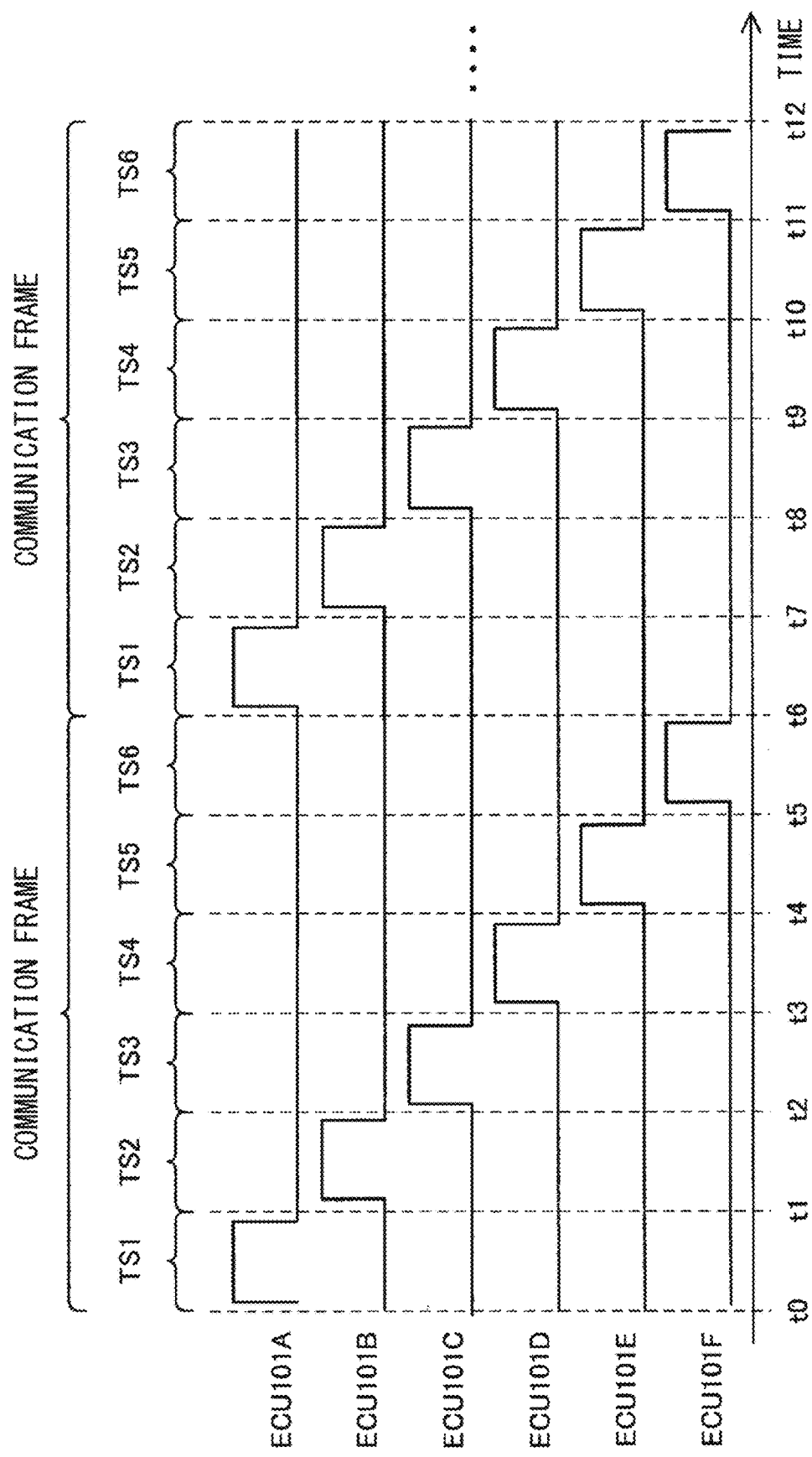
FIG. 7 is an example of a timing chart showing timings at which ECUs transmit optical signals in the in-vehicle communication system according to the embodiment of the present disclosure.

FIG. 7 is an example of a timing chart showing timings at which the ECUs transmit optical signals in the in-vehicle communication system according to the embodiment of the present disclosure. With reference to FIG. 7, the ECU 101A transmits an optical signal to the ECUs 101 in the second in-vehicle device group Gr2 via the optical coupler 201, in the time slot TS1 from time t0 to time t1. The ECU 101B transmits an optical signal to the ECUs 101 in the second in-vehicle device group Gr2 via the optical coupler 201, in the time slot TS2 from time t1 to time t2. The ECU 101C transmits an optical signal to the ECUs 101 in the second in-vehicle device group Gr2 via the optical coupler 201, in the time slot TS3 from time t2 to time t3.

The ECU 101D transmits an optical signal to the ECUs 101 in the first in-vehicle device group Gr1 via the optical coupler 201, in the time slot TS4 from time t3 to time t4. The ECU 101E transmits an optical signal to the ECUs 101 in the first in-vehicle device group Gr1 via the optical coupler 201, in the time slot TS5 from time t4 to time t5. The ECU 101F transmits an optical signal to the ECUs 101 in the first in-vehicle device group Gr1 via the optical coupler 201, in the time slot TS6 from time t5 to time t6.

More specifically, the processing unit 40 in each ECU 101 outputs, based on the slot information in the storage unit 70, a frame to be transmitted to another ECU 101, in the time slot of the ECU 101 indicated by the slot information, to the optical fiber cable 212 via the transmission unit 30 and the optical transceiver 10.

For example, the processing unit 40 in each of the ECUs 101B, 101C, 101D, 101E, 101F including the reception CDR circuits 21 turns off the own reception CDR circuit 21 in the time slots TS assigned to the ECUs 101 in the own group out of the first in-vehicle device group Gr1 and the second in-vehicle device group Gr2. Furthermore, for example, the processing unit 40 in each of the ECUs 101B, 101C, 101D, 101E, 101F turns on the own reception CDR circuit 21 in the time slots TS assigned to the ECUs 101 in the group other than the own group out of the first in-vehicle device group Gr1 and the second in-vehicle device group Gr2.

Specifically, the processing unit 40 in each of the ECUs 101D, 101E, 101F turns on the own reception CDR circuit 21 in the time slots TS1, TS2, TS3, and turns off the own reception CDR circuit 21 in the time slots TS4, TS5, TS6. The processing unit 40 in each of the ECUs 101B, 101C turns on the own reception CDR circuit 21 in the time slots TS4, TS5, TS6, and turns off the own reception CDR circuit 21 in the time slots TS1, TS2, TS3.

For example, the processing unit 40 in each of the ECUs 101D, 101E, 101F turns on the own reception CDR circuit 21 at start time t0 of the time slot TS1, and turns off the own reception CDR circuit 21 at start time t3 of the time slot TS4. The processing unit 40 in each of the ECUs 101B, 101C turns off the own reception CDR circuit 21 at start time t0 of the time slot TS1, and turns on the own reception CDR circuit 21 at start time t3 of the time slot TS4.

The processing unit 40 in each of the ECUs 101D, 101E, 101F may turn off the own reception CDR circuit 21 immediately before start times t0, t1, t2 of the time slots TS1, TS2, TS3, and may again turn on the own reception CDR circuit 21 immediately after times t0, t1, t2. The processing unit 40 in each of the ECUs 101B, 101C may turn off the own reception CDR circuit 21 immediately before start times t3, t4, t5 of the time slots TS4, TS5, TS6, and may again turn on the own reception CDR circuit 21 immediately after times t3, t4, t5.

Modifications

Figure 8:
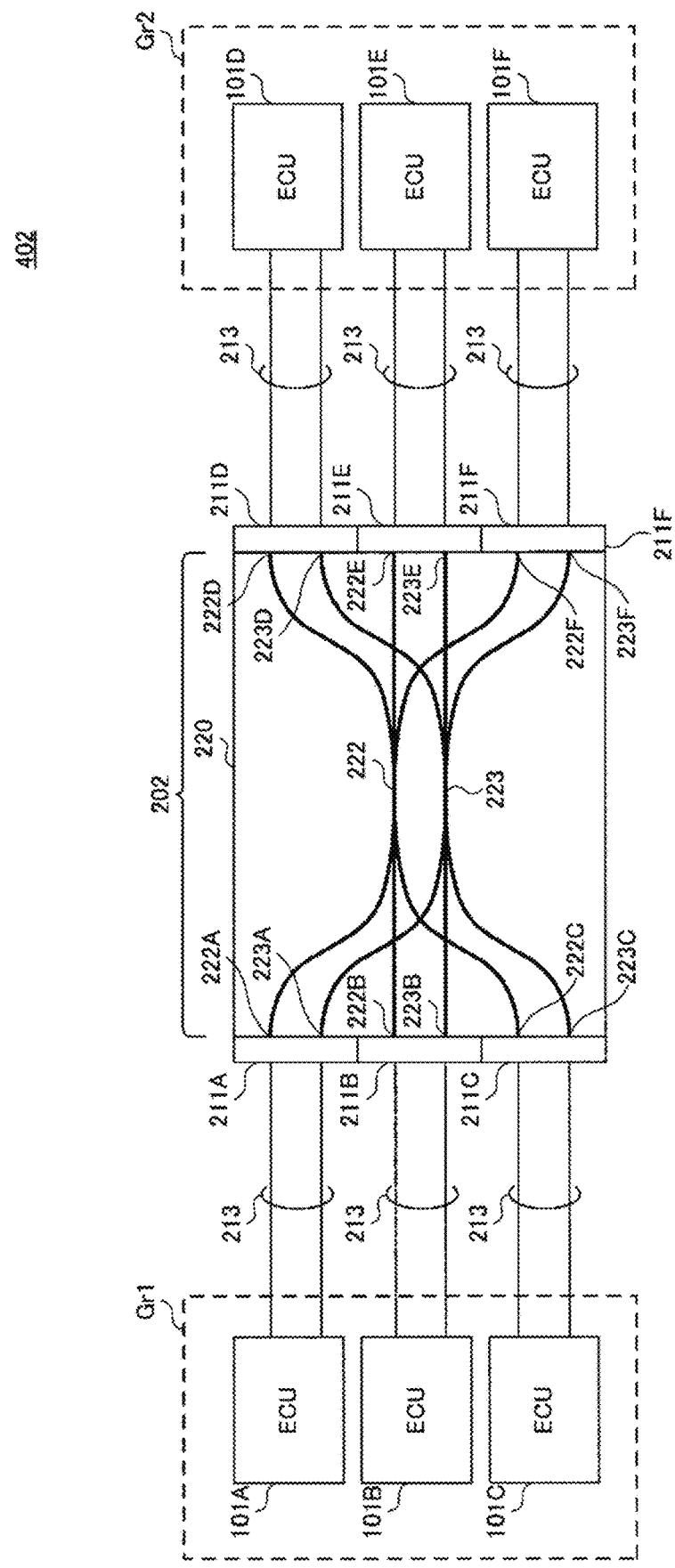
FIG. 8 shows an example of a configuration of an in-vehicle communication system according to a modification of the embodiment according to the present disclosure.

FIG. 8 shows an example of a configuration of an in-vehicle communication system according to a modification of the embodiment of the present disclosure. With reference to FIG. 8, an in-vehicle communication system 402 according to the modification is different from the in-vehicle communication system 401 in that it includes an optical coupler 202 instead of the optical coupler 201.

More specifically, the optical coupler 202 includes a body portion 220, and optical waveguides 222, 223 formed in the body portion 220. The optical waveguide 222 is a first transmission path for transmitting optical signals from the ECUs 101A, 101B, 101C in the first in-vehicle device group Gr1 to the ECUs 101D, 101E, 101F in the second in-vehicle device group Gr2. The optical waveguide 223 is a second transmission path for transmitting optical signals from the ECUs 101D, 101E, 101F in the second in-vehicle device group Gr2 to the ECUs 101A, 101B, 101C in the first in-vehicle device group Gr1.

Each of the optical waveguides 222, 223 is formed in the body portion 220 so as to extend between connection parts 211A, 211B, 211C disposed at a first end of the optical coupler 202 and connection parts 211D, 211E, 211F disposed at a second end of the optical coupler 202.

The optical waveguides 222, 223 have branch parts. For example, the optical waveguide 222 has a first end 222A connected to the connection part 211A, a second end 222B connected to the connection part 212B, a third end 222C connected to the connection part 212C, a fourth end 222D connected to the connection part 212D, a fifth end 222E connected to the connection part 212E, and a sixth end 222F connected to the connection part 212F.

For example, the optical waveguide 223 has a first end 223A connected to the connection part 211A, a second end 223B connected to the connection part 212B, a third end 223C connected to the connection part 212C, a fourth end 223D connected to the connection part 212D, a fifth end 223E connected to the connection part 212E, and a sixth end 223F connected to the connection part 212F.

The ECUs 101A, 101B, 101C are connected to the connection parts 211A, 211B, 211C via the optical fiber cables 213, respectively. Each optical fiber cable 213 is a 2-core cable. The first end 222A of the optical waveguide 222 and the first end 223A of the optical waveguide 223 are optically connected to a first core and a second core of the corresponding optical fiber cable 213 at the connection part 211A, respectively. The second end 222B of the optical waveguide 222 and the second end 223B of the optical waveguide 223 are optically connected to a first core and a second core of the corresponding optical fiber cable 213 at the connection part 211B, respectively. The third end 222C of the optical waveguide 222 and the third end 223C of the optical waveguide 223 are optically connected to a first core and a second core of the corresponding optical fiber cable 213 at the connection part 211C, respectively.

The ECUs 101C, 101D, 101E are connected to the connection parts 211C, 211D, 211E via the optical fiber cables 213, respectively. The fourth end 222D of the optical waveguide 222 and the fourth end 223D of the optical waveguide 223 are optically connected to a first core and a second core of the corresponding optical fiber cable 213 at the connection part 211D, respectively. The fifth end 222E of the optical waveguide 222 and the fifth end 223E of the optical waveguide 223 are optically connected to a first core and a second core of the corresponding optical fiber cable 213 at the connection part 211E, respectively. The sixth end 222F of the optical waveguide 222 and the sixth end 223F of the optical waveguide 223 are optically connected to a first core and a second core of the corresponding optical fiber cable 213 at the connection part 211F, respectively.

Figure 9:
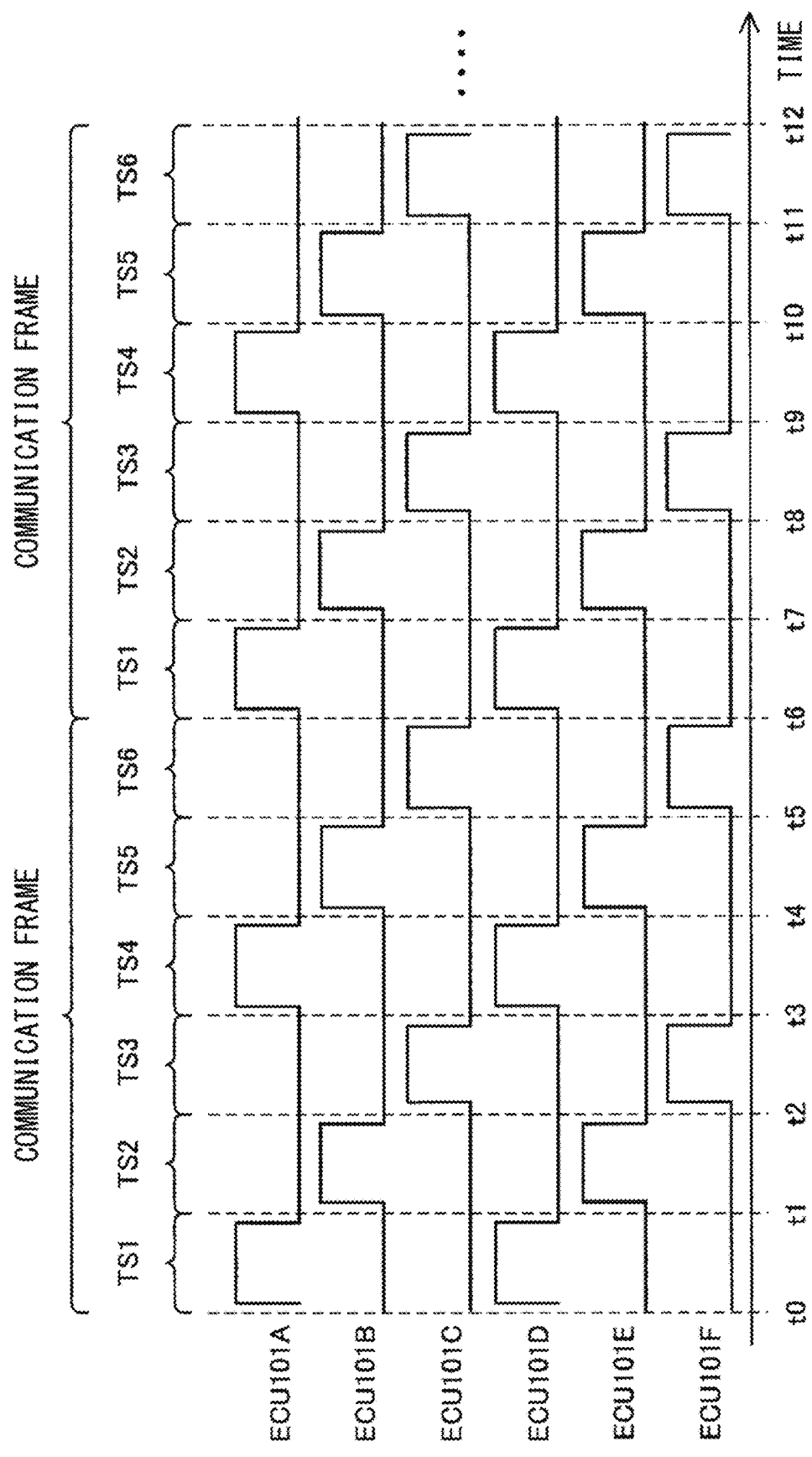
FIG. 9 is an example of a timing chart showing timings at which ECUs transmit optical signals in the in-vehicle communication system according to the modification of the embodiment of the present disclosure.

FIG. 9 is an example of a timing chart showing timings at which the ECUs transmit optical signals in the in-vehicle communication system according to the modification of the embodiment of the present disclosure. With reference to FIG. 9, a common time slot TS is assigned to at least one of the ECUs 101 in the first in-vehicle device group Gr1 and to at least one of the ECUs 101 in the second in-vehicle device group Gr2.

Specifically, time slots TS1, TS4 are assigned to the ECUs 101A, 101D. More specifically, in the time slots TS1, TS4, the ECU 101A transmits optical signals to the ECUs 101 in the second in-vehicle device group Gr2 via the optical waveguide 222 in the optical coupler 202. In the time slots TS1, TS4, the ECU 101D transmits optical signals to the ECUs 101 in the first in-vehicle device group Gr1 via the optical waveguide 223 in the optical coupler 202.

Time slots TS2, TS5 are assigned to the ECUs 101B, 101E. Specifically, in the time slots TS2, TS5, the ECU 101B transmits optical signals to the ECUs 101 in the second in-vehicle device group Gr2 via the optical waveguide 222 in the optical coupler 202. In the time slots TS2, TS5, the ECU 101E transmits optical signals to the ECUs 101 in the first in-vehicle device group Gr1 via the optical waveguide 223 in the optical coupler 202.

Time slots TS3, TS6 are assigned to the ECUs 101C, 101F. Specifically, in the time slots TS3, TS6, the ECU 101C transmits optical signals to the ECUs 101 in the second in-vehicle device group Gr2 via the optical waveguide 222 in the optical coupler 202. In the time slots TS3, TS6, the ECU 101F transmits optical signals to the ECUs 101 in the first in-vehicle device group Gr1 via the optical waveguide 223 in the optical coupler 202.

Operation Flow

Each of the devices in the in-vehicle communication system according to the embodiment of the present disclosure includes a computer that includes a memory. An arithmetic processing unit such as a CPU in the computer reads out, from the memory, a program including a part or all of steps in the flow chart and sequence described below, and executes the program. Programs of the plurality of devices can each be installed from outside. The programs of the plurality of devices are each distributed in a state of being stored in a storage medium.

Figure 10:
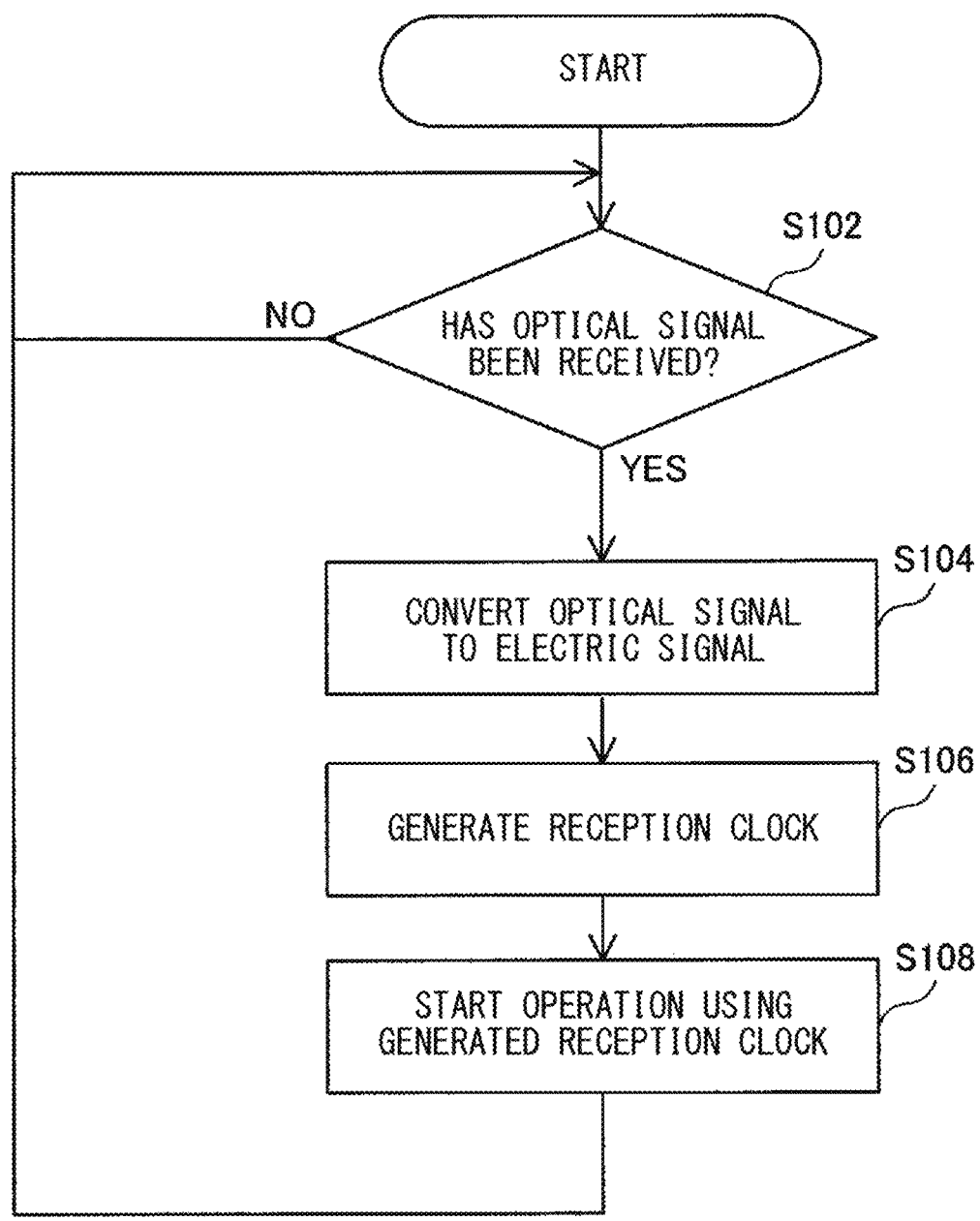
FIG. 10 is a flowchart showing an example of an operation procedure when an ECU performs a clock synchronization process in the in-vehicle communication system according to the embodiment of the present disclosure.

FIG. 10 is a flowchart showing an example of an operation procedure when an ECU performs a clock synchronization process in the in-vehicle communication system according to the embodiment of the present disclosure. FIG. 10 shows the operation procedure when an ECU 101 other than the ECU 101A performs the clock synchronization process.

With reference to FIG. 10, firstly, an ECU 101 waits for an optical signal from another ECU 101. More specifically, each of the ECUs 101D, 101E, 101F in the second in-vehicle device group Gr2 waits for an optical signal transmitted from the ECU 101A. Likewise, each of the ECUs 101B, 101C in the first in-vehicle device group Gr1 waits for an optical signal that corresponds to a control frame from the ECU 101A and is transmitted by the ECU 101D (NO in step S102). Upon receiving an optical signal (YES in step S102), the ECU 101 converts the received optical signal into an electric signal (step S104).

Next, the ECU 101 generates a reception clock, based on the electric signal (step S106).

Next, the ECU 101 starts an operation using the generated reception clock (step S108).

Next, the ECU 101 waits for a new optical signal from another ECU 101 (NO in step S102).

Figure 11:
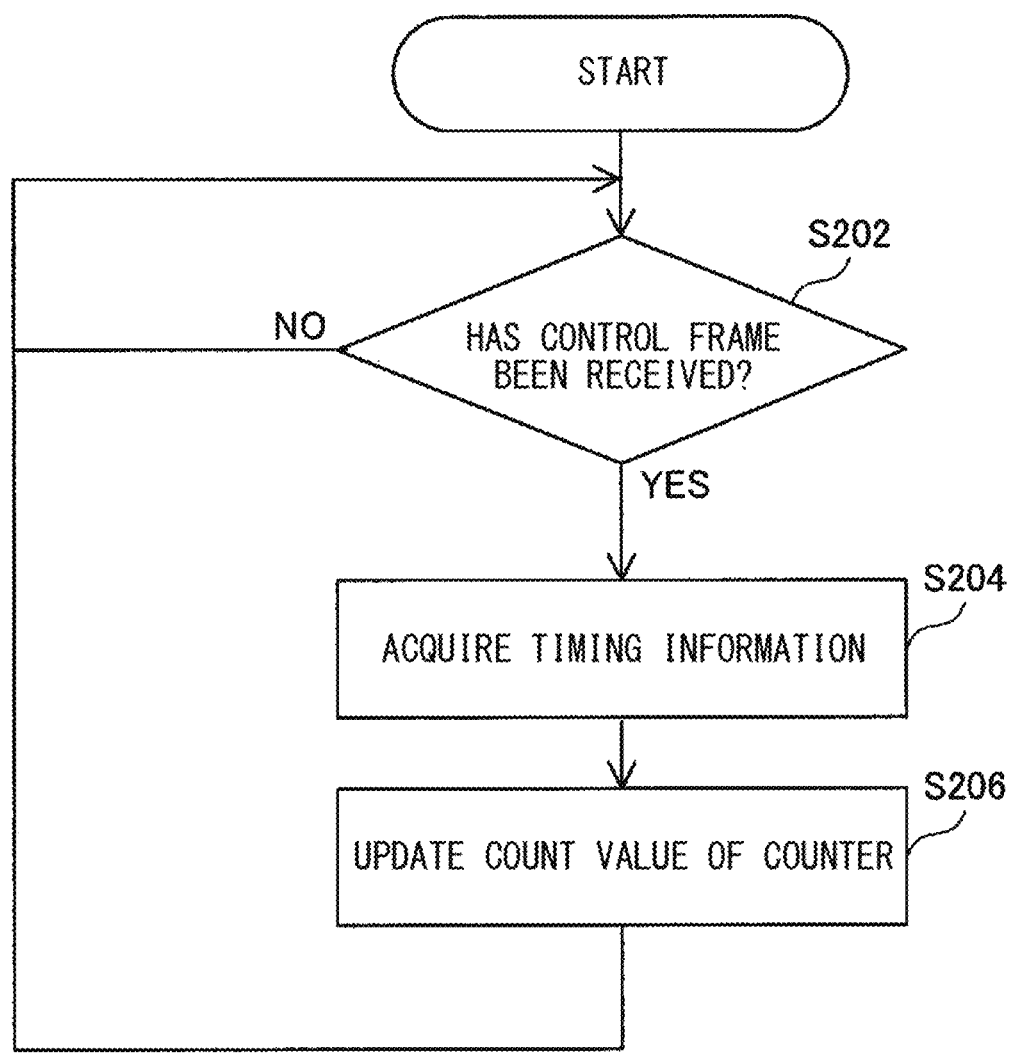
FIG. 11 is a flowchart showing an example of an operation procedure when an ECU performs a time synchronization process in the in-vehicle communication system according to the embodiment of the present disclosure.

FIG. 11 is a flowchart showing an example of an operation procedure when an ECU performs a time synchronization process in the in-vehicle communication system according to the embodiment of the present disclosure.

With reference to FIG. 11, first, an ECU 101 waits for a control frame from another ECU 101. More specifically, each of the ECUs 101D, 101E, 101F in the second in-vehicle device group Gr2 waits for a control frame transmitted from the ECU 101A. Furthermore, each of the ECUs 101B, 101C in the first in-vehicle device group Gr1 waits for a control frame, from the ECU 101A, transferred by the ECU 101D (NO in step S202). Upon receiving the control frame (YES in step S202), the ECU 101 acquires timing information from the received control frame (step S204).

Next, the ECU 101 updates the count value of the counter 50, based on the acquired timing information. More specifically, each of the ECUs 101D, 101E, 101F updates the count value of the counter 50 to a value obtained by adding the count value indicated by the timing information to the count value corresponding to the propagation delay D1. Furthermore, each of the ECUs 101B, 101C updates the count value of the counter 50 to a value obtained by adding the count value indicated by the timing information, to the count values corresponding to the propagation delays D1, D2 and the transfer delay time D3 (step S206).

Next, the ECU 101 waits for a new control frame from another ECU 101 (NO in step S202).

Figure 12:
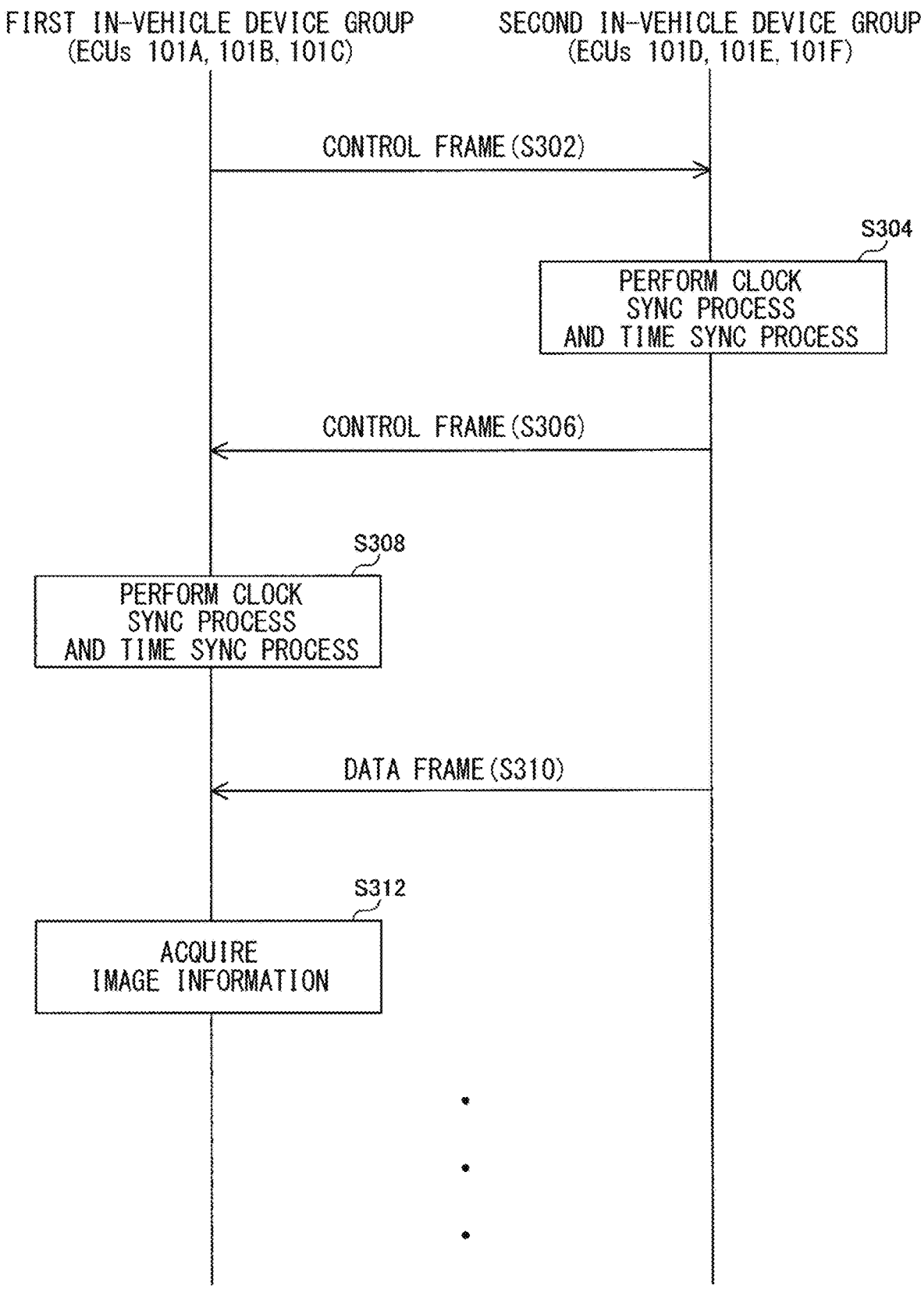
FIG. 12 shows an example of a communication sequence in the in-vehicle communication system according to the embodiment of the present disclosure.

FIG. 12 shows an example of a communication sequence in the in-vehicle communication system according to the embodiment of the present disclosure.

With reference to FIG. 12, first, the ECU 101A as a master device in the first in-vehicle device group Gr1 converts an electric signal indicating a control frame into an optical signal at a synchronization processing timing, and transmits the optical signal in a time slot TS assigned thereto, to the ECUs 101D, 101E, 101F in the second in-vehicle device group Gr2 via the optical coupler 201 (step S302).

Upon receiving the optical signal from the ECU 101A, each of the ECUs 101D, 101E, 101F in the second in-vehicle device group Gr2 performs a clock synchronization process based on the optical signal, and performs a time synchronization process based on a control frame that is generated by reconstituting an electric signal based on the optical signal (step S304).

Next, the ECU 101D as a sub-master device transfers the control frame received from the ECU 101A, to the first in-vehicle device group Gr1. More specifically, the ECU 101D converts the electric signal indicating the control frame into an optical signal, and transmits the optical signal in a time slot TS assigned thereto, to the ECUs 101A, 101B, 101C via the optical coupler 201 (step S306).

Next, upon receiving the optical signal from the ECU 101D, each of the ECUs 101B, 101C performs a clock synchronization process based on the optical signal, and performs a time synchronization process based on a control frame generated by reconstituting an electric signal based on the optical signal (step S308).

Next, each of the ECUs 101D, 101E, 101F converts an electric signal indicating a data frame in which image information is stored, into an optical signal, and transmits the optical signal in a time slot TS assigned thereto, to the ECUs 101A, 101B, 101C via the optical coupler 201 (step S310).

Next, upon receiving the optical signals from the ECUs 101D, 101E, 101F, each of the ECUs 101A, 101B, 101C acquires the image information from the data frame generated by reconstituting an electric signal based on the optical signals. Based on the acquired image information, each of the ECUs 101A, 101B performs an automated driving control. The ECU 101C accumulates the acquired image information in the storage unit 70 (step S312).

In the in-vehicle communication systems 401, 402 according to the embodiment of the present disclosure, the ECU 101A serving as a master device transmits the timing information and the slot information to the second in-vehicle device group Gr2. However, the present disclosure is not limited thereto. The ECU 101A may not transmit at least one of the timing information and the slot information to the second in-vehicle device group Gr2.

In the in-vehicle communication systems 401, 402 according to the embodiment of the present disclosure, the ECU 101D serving as a sub-master device transmits the timing information and the slot information received from the ECU 101A to the first in-vehicle device group Gr1. However, the present disclosure is not limited thereto. The ECU 101D may not transmit at least one of the timing information and the slot information to the first in-vehicle device group Gr1. Instead of the ECU 101D, the ECU 101E or the ECU 101F may transmit the timing information or the slot information received from the ECU 101A to the first in-vehicle device group Gr1, based on an instruction from the ECU 101A, for example.

In the in-vehicle communication systems 401, 402 according to the embodiment of the present disclosure, in the time synchronization process, the processing unit 40 in each of the ECUs 101B, 101C updates the count value of the counter 50 to a value obtained by adding the count value indicated by the timing information, to the count values corresponding to the propagation delays D1, D2 and the transfer delay time D3. However, the present disclosure is not limited thereto. The processing unit 40 in each of the ECUs 101B, 101C may update the count value of the counter 50 to the count value indicated by the timing information.

In the in-vehicle communication systems 401, 402 according to the embodiment of the present disclosure, the processing unit 40 in each of the ECUs 101B, 101C, 101D, 101E, 101F turns off the own reception CDR circuit 21 in the time slots TS assigned to the ECUs 101 in the own group. However, the present disclosure is not limited thereto. For example, the processing unit 40 in each of the ECUs 101B, 101C, 101D, 101E, 101F may keep the own reception CDR circuit 21 in the ON state in the time slots TS assigned to the ECUs 101 in the own group.

Each of the in-vehicle communication systems 401, 402 according to the embodiment of the present disclosure is provided with the first in-vehicle device group Gr1 and the second in-vehicle device group Gr2. However, the present disclosure is not limited thereto. Each of the in-vehicle communication systems 401, 402 may be further provided with an in-vehicle device group composed of one or a plurality of ECUs 101 in addition to the first in-vehicle device group Gr1 and the second in-vehicle device group Gr2.

The above embodiment is merely illustrative in all aspects and should not be recognized as being restrictive. The scope of the present disclosure is defined by the scope of the claims rather than by the description above, and is intended to include meaning equivalent to the scope of the claims and all modifications within the scope.

The above description includes the features in the additional note below.

Additional Note 1

An in-vehicle communication system comprising:
an optical coupler;
a first in-vehicle device group composed of a plurality of in-vehicle devices connected to a first end of the optical coupler; and
a second in-vehicle device group composed of a plurality of in-vehicle devices connected to a second end of the optical coupler, wherein
the in-vehicle devices in the first in-vehicle device group are communicable with the in-vehicle devices in the second in-vehicle device group via a common transmission path in the optical coupler,
the in-vehicle devices in the second in-vehicle device group are communicable with the in-vehicle devices in the first in-vehicle device group via a common transmission path in the optical coupler,
a master device, which is one in-vehicle device among the plurality of in-vehicle devices in the first in-vehicle device group, transmits timing information that is information to be used for a time synchronization process by the in-vehicle devices in the in-vehicle communication system, to the second in-vehicle device group via the optical coupler,
a sub-master device, which is one in-vehicle device among the plurality of in-vehicle devices in the second in-vehicle device group, transmits the timing information received from the master device to the first in-vehicle device group via the optical coupler, and
the in-vehicle devices other than the master device among the plurality of in-vehicle devices in the first in-vehicle device group perform the time synchronization process, based on the timing information received from the sub-master device, a propagation delay of an optical signal transmitted from the master device to the second in-vehicle device group, and a propagation delay of an optical signal transmitted from the second in-vehicle device group to the first in-vehicle device group.

REFERENCE SIGNS LIST 10 optical transceiver
20, 20A reception unit
21 reception CDR circuit
30, 30A transmission unit
31 transmission CDR circuit
40 processing unit
50 counter
60 clock generator
70 storage unit
81, 91 phase comparator
82, 92 charge pump & loop filter
83, 93 VCXO
84, 94 frequency dividing circuit
85 sampling circuit
86, 96 multiplication circuit
87, 97 frequency comparator
88, 98 PLL circuit
95 retiming circuit
101A, 101B, 101C, 101D, 101E, 101F ECU
201, 202 optical coupler
211A, 211B, 211C, 211D, 211E, 211F connection part
212, 213 optical fiber cable
220 body portion
221 optical waveguide
221A, 222A, 223A first end
221B, 222B, 223B second end
221C, 222C, 223C third end
221D, 222D, 223D fourth end
221E, 222E, 223E fifth end
221F, 222F, 223F sixth end
401, 402 in-vehicle communication system
Gr1 first in-vehicle device group
Gr2 second in-vehicle device group

The invention claimed is:

1. An in-vehicle communication system comprising:
an optical coupler;
a first in-vehicle device group composed of a plurality of in-vehicle devices connected to a first end of the optical coupler; and
a second in-vehicle device group composed of a plurality of in-vehicle devices connected to a second end of the optical coupler, wherein
the plurality of in-vehicle devices in the first in-vehicle device group are communicable with the plurality of in-vehicle devices in the second in-vehicle device group via a common transmission path in the optical coupler, and
the plurality of in-vehicle devices in the second in-vehicle device group are communicable with the plurality of in-vehicle devices in the first in-vehicle device group via a common transmission path in the optical coupler,
wherein a master device, which is one in-vehicle device among the plurality of in-vehicle devices in the first in-vehicle device group, transmits timing information that is information to be used for a time synchronization process by the in-vehicle devices in the first and second in-vehicle device groups, to the second in-vehicle device group via the optical coupler,
wherein one in-vehicle device among the plurality of in-vehicle devices in the second in-vehicle device group transmits the timing information received from the master device, to the first in-vehicle device group via the optical coupler,
wherein the master device transmits, to the second in-vehicle device group via the optical coupler, slot information indicating time slots that are assigned to the respective in-vehicle devices in the first and second in-vehicle device groups, and
wherein the one in-vehicle device among the plurality of in-vehicle devices in the second in-vehicle device group transmits the slot information received from the master device, to the first in-vehicle device group via the optical coupler.

2. The in-vehicle communication system according to claim 1, wherein
the in-vehicle devices other than the master device among the plurality of in-vehicle devices in the first in-vehicle device group perform the time synchronization process, based on the timing information received from the second in-vehicle device group, a propagation delay of an optical signal transmitted from the master device to the second in-vehicle device group, and a propagation delay of an optical signal transmitted from the second in-vehicle device group to the first in-vehicle device group.

3. The in-vehicle communication system according to claim 2, wherein
at least one of the in-vehicle devices in the first and second in-vehicle device groups includes a clock synchronization circuit that performs a clock synchronization process with the in-vehicle devices other than the master device, and
the in-vehicle device including the clock synchronization circuit turns off the clock synchronization circuit in time slots assigned to the in-vehicle devices in an own group out of the first in-vehicle device group and the second in-vehicle device group.

4. The in-vehicle communication system according to claim 3, wherein
the optical coupler includes: a first transmission path that is the transmission path for transmitting an optical signal from the plurality of in-vehicle devices in the first in-vehicle device group to the plurality of in-vehicle devices in the second in-vehicle device group; and a second transmission path that is the transmission path for transmitting an optical signal from the plurality of in-vehicle devices in the second in-vehicle device group to the plurality of in-vehicle devices in the first in-vehicle device group, and
a common time slot is assigned to at least one in-vehicle device among the plurality of in-vehicle devices in the first in-vehicle device group and to at least one in-vehicle device among the plurality of in-vehicle devices in the second in-vehicle device group.

5. The in-vehicle communication system according to claim 2, wherein
the optical coupler includes: a first transmission path that is the transmission path for transmitting an optical signal from the plurality of in-vehicle devices in the first in-vehicle device group to the plurality of in-vehicle devices in the second in-vehicle device group; and a second transmission path that is the transmission path for transmitting an optical signal from the plurality of in-vehicle devices in the second in-vehicle device group to the plurality of in-vehicle devices in the first in-vehicle device group, and a common time slot is assigned to at least one in-vehicle device among the plurality of in-vehicle devices in the first in-vehicle device group and to at least one in-vehicle device among the plurality of in-vehicle devices in the second in-vehicle device group.

6. The in-vehicle communication system according to claim 1, wherein
at least one of the in-vehicle devices in the first and second in-vehicle device groups includes a clock synchronization circuit that performs a clock synchronization process with the in-vehicle devices other than the master device, and
the in-vehicle device including the clock synchronization circuit turns off the clock synchronization circuit in time slots assigned to the in-vehicle devices in an own group out of the first in-vehicle device group and the second in-vehicle device group.

7. The in-vehicle communication system according to claim 6, wherein
the optical coupler includes: a first transmission path that is the transmission path for transmitting an optical signal from the plurality of in-vehicle devices in the first in-vehicle device group to the plurality of in-vehicle devices in the second in-vehicle device group; and a second transmission path that is the transmission path for transmitting an optical signal from the plurality of in-vehicle devices in the second in-vehicle device group to the plurality of in-vehicle devices in the first in-vehicle device group, and
a common time slot is assigned to at least one in-vehicle device among the plurality of in-vehicle devices in the first in-vehicle device group and to at least one in-vehicle device among the plurality of in-vehicle devices in the second in-vehicle device group.

8. The in-vehicle communication system according to claim 1, wherein
the optical coupler includes: a first transmission path that is the transmission path for transmitting an optical signal from the plurality of in-vehicle devices in the first in-vehicle device group to the plurality of in-vehicle devices in the second in-vehicle device group; and a second transmission path that is the transmission path for transmitting an optical signal from the plurality of in-vehicle devices in the second in-vehicle device group to the plurality of in-vehicle devices in the first in-vehicle device group, and
a common time slot is assigned to at least one in-vehicle device among the plurality of in-vehicle devices in the first in-vehicle device group and to at least one in-vehicle device among the plurality of in-vehicle devices in the second in-vehicle device group.

9. A communication method in an in-vehicle communication system including,
an optical coupler,
a first in-vehicle device group composed of a plurality of in-vehicle devices connected to a first end of the optical coupler, and
a second in-vehicle device group composed of a plurality of in-vehicle devices connected to a second end of the optical coupler,
the method comprising:
transmitting optical signals from the plurality of in-vehicle devices in the first in-vehicle device group to the plurality of in-vehicle devices in the second in-vehicle device group via a common transmission path in the optical coupler; and
transmitting optical signals from the plurality of in-vehicle devices in the second in-vehicle device group to the plurality of in-vehicle devices in the first in-vehicle device group via a common transmission path in the optical coupler,
wherein a master device, which is one in-vehicle device among the plurality of in-vehicle devices in the first in-vehicle device group, transmits timing information that is information to be used for a time synchronization process by the in-vehicle devices in the first and second in-vehicle device groups, to the second in-vehicle device group via the optical coupler,
wherein one in-vehicle device among the plurality of in-vehicle devices in the second in-vehicle device group transmits the timing information received from the master device, to the first in-vehicle device group via the optical coupler,
wherein the master device transmits, to the second in-vehicle device group via the optical coupler, slot information indicating time slots that are assigned to the respective in-vehicle devices in the first and second in-vehicle device groups, and
wherein the one in-vehicle device among the plurality of in-vehicle devices in the second in-vehicle device group transmits the slot information received from the master device, to the first in-vehicle device group via the optical coupler.

* * * * *